United States Patent
Asghari et al.

(10) Patent No.: US 11,635,491 B2
(45) Date of Patent: Apr. 25, 2023

(54) AMPLIFICATION OF LIDAR OUTPUT SIGNALS

(71) Applicant: SiLC Technologies, Inc., Monrovia, CA (US)

(72) Inventors: Mehdi Asghari, La Canada Flintridge, CA (US); Dazeng Feng, El Monte, CA (US); Bradley Jonathan Luff, La Canada Flintridge, CA (US)

(73) Assignee: SiLC Technologies, Inc., Monrovia, CA (US)

( * ) Notice: Subject to any disclaimer, the term of this patent is extended or adjusted under 35 U.S.C. 154(b) by 376 days.

(21) Appl. No.: 16/810,807

(22) Filed: Mar. 5, 2020

(65) Prior Publication Data

US 2020/0284879 A1  Sep. 10, 2020

Related U.S. Application Data

(60) Provisional application No. 62/814,844, filed on Mar. 6, 2019.

(51) Int. Cl.
*H01S 5/14* (2006.01)
*G01S 7/481* (2006.01)

(52) U.S. Cl.
CPC .......... *G01S 7/4814* (2013.01); *G01S 7/4818* (2013.01); *H01S 5/141* (2013.01)

(58) Field of Classification Search
CPC ........... G02B 2006/12009; G02B 2006/12097; G02B 2006/1215; G02B 2006/12088; G02B 2006/12138; G02B 2006/12147; G02B 2006/12159; G02B 2006/12164; G02B 6/10; G02B 6/122; G02B 6/124; G02B 6/305; G02B 6/29325; G02B 6/3542; G02B 27/14; G02B 26/0833;
(Continued)

(56) References Cited

U.S. PATENT DOCUMENTS 6,400,500 B1   6/2002  Tidmarsh et al.
7,375,877 B1 *  5/2008  Di Teodoro ............ C03B 37/10
                                                359/341.41
(Continued)

FOREIGN PATENT DOCUMENTS

CN   105680320 A  *  6/2016  ............... H01S 5/06
CN   105680320 A     6/2016
(Continued)

OTHER PUBLICATIONS

English translation of EP3339924A1 (Year: 2018).*
(Continued)

*Primary Examiner* — Charlie Y Peng
(74) *Attorney, Agent, or Firm* — Gavrilovich, Dodd & Lindsey LLP

(57) ABSTRACT

A LIDAR system includes a LIDAR chip that generates a LIDAR output signal. The LIDAR chip includes a utility waveguide configured to carry one or more light signals selected from an outgoing LIDAR signal and an incoming LIDAR signal. The system also includes an amplifier that has an amplifier waveguide with a first facet and a second facet. The amplifier being positioned such that the first facet is optically aligned with a facet of the utility waveguide but the second facet is not optically aligned with any waveguide.

37 Claims, 13 Drawing Sheets

(58) Field of Classification Search
CPC .. H01S 5/0071; H01S 5/0085; H01S 5/02325; H01S 5/141
See application file for complete search history.

(56) References Cited

U.S. PATENT DOCUMENTS

| | | | |
|---|---|---|---|
| 10,782,782 B1* | 9/2020 | DeSalvo | G06K 19/07762 |
| 2005/0135730 A1 | 6/2005 | Welch et al. | |
| 2011/0091155 A1 | 4/2011 | Yilmaz et al. | |
| 2013/0083389 A1 | 4/2013 | Dakin et al. | |
| 2016/0170141 A1 | 6/2016 | Luo et al. | |
| 2017/0040775 A1 | 2/2017 | Takabayashi et al. | |
| 2017/0207600 A1 | 7/2017 | Klamkin et al. | |
| 2017/0371227 A1* | 12/2017 | Skirlo | G02F 1/2955 |
| 2018/0217471 A1 | 8/2018 | Lee et al. | |
| 2019/0346568 A1 | 11/2019 | Feng et al. | |
| 2020/0116837 A1* | 4/2020 | Aghari | G01S 7/4865 |
| 2020/0116842 A1* | 4/2020 | Aghari | G01S 17/08 |
| 2020/0284879 A1 | 9/2020 | Asghari | |

FOREIGN PATENT DOCUMENTS

| | | |
|---|---|---|
| EP | 3339924 A1 * | 6/2018 |
| WO | 2019/217761 A1 | 11/2019 |

OTHER PUBLICATIONS

Young, Lee, International Search Report and Written Opinion, PCT/US2020/021279, International Searching Authority, United States Patent and Trademark Office, dated Nov. 30, 2020.

Baghmisheh, B. B., "Chip-scale Lidar" University of California, Berkeley, Jan. 19, 2017, Technical Report No. UCB/EECS-2017-4, http://www2.eecs.berkeley.edu/Pubs/TechRpts/2017/EECS-2017-4.html.

Issakov, V., (2010), Radar Systems, Ch. 2. In Microwave Circuits for 24GHz Automotive Radar in Silicon-based Technologies. Berlin Heidelberg: Springer-Verlag.

Li, L., (2014), Time-of-Flight Camera—An Introduction. TI Technical White Paper SLOA190BLI, L., (2014), Time-of-Flight Camera—An Introduction. TI Technical White Paper SLOA190B.

Cortona, Anna, Partial Supplementary European Search Report, European Patent Office, Application No. 20821627.5, dated Oct. 12, 2022.

* cited by examiner

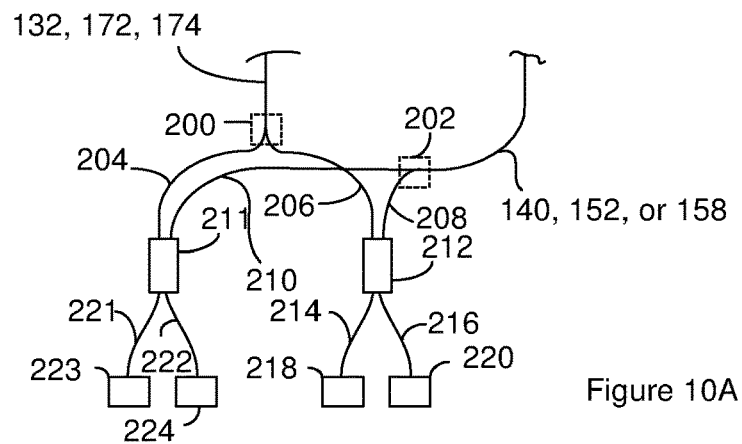
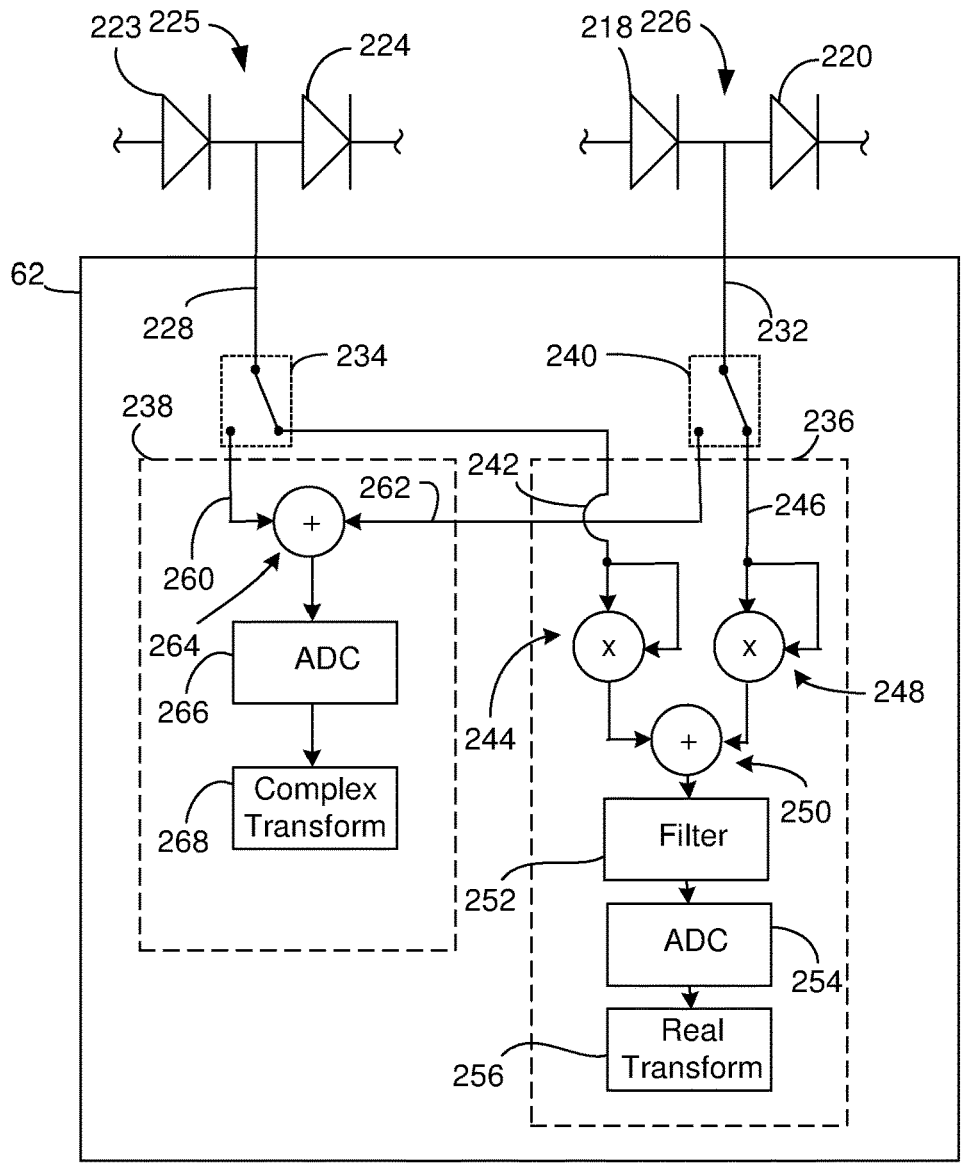
Figure 10A
Figure 10B

AMPLIFICATION OF LIDAR OUTPUT SIGNALS

RELATED APPLICATIONS

This patent application claims the benefit of U.S. Provisional Patent Application Ser. No. 62/814,844, filed on Mar. 6, 2019, and incorporated herein in its entirety.

FIELD

The invention relates to optical devices. In particular, the invention relates to LIDAR systems.

BACKGROUND

LIDAR technologies are being applied to a variety of applications. LIDAR technologies generate a LIDAR output signal that is transmitted from a source such as a LIDAR chip. An object that is located remotely from the source reflects the LIDAR output signal. The reflected light signal serves as a LIDAR input signal and is received by the source. The LIDAR input signal carries LIDAR data that indicates the distance and/or radial velocity between the source of the LIDAR output signal and a reflecting object. In some instances, the source and/or electronics associated with the source can process the LIDAR input signal so as extract the LIDAR data.

A platform capable of integrating all of the electrooptical functions required for a generating LIDAR output signals and extracting the LIDAR data is highly desirable. For instance, it is desirable for these functions to be integrated on a LIDAR chip. However, lasers are often used as the source of the LIDAR output signals in platforms such as LIDAR chips. However, limitations in the output power of these lasers limit the power of the LIDAR output signals in these platforms. The limited power of the LIDAR output signal also limits the power available of the light signals that carry the LIDAR data. The available laser sources are particularly limited in output power when multiple different LIDAR output signals (different wavelength channels) are generated. Waveguide and coupling losses can also further limit the optical power available for detection on the receive path by reducing the level of the light signals that return to the LIDAR chip after being reflected by an object. Performance parameters such as range and measurement precision are strongly dependent on the received optical power. As a result, there is a need for LIDAR platforms such as LIDAR chips with increased power of LIDAR output signals and/or increased power on the receive path.

SUMMARY

A LIDAR system includes a LIDAR chip that transmits a LIDAR output signal. The LIDAR chip includes one or more chip waveguides. The one or more chip waveguides include a utility waveguide configured to carry one or more light signals selected from an outgoing LIDAR signal and an incoming LIDAR signal. The system also includes an amplifier that has an amplifier waveguide with a first facet and a second facet. The amplifier being positioned such that the first facet is optically aligned with a facet of the utility waveguide but the second facet is not optically aligned with any of the one or more LIDAR chip waveguides.

Another embodiment of a LIDAR system has a LIDAR chip that include a first waveguide and a second waveguide. The LIDAR system also has an amplifier chip that includes an amplifier waveguide with a first facet and a second facet. The amplifier chip is positioned on the LIDAR chip such that the first facet is optically aligned with a facet of the first waveguide and the second facet is optically aligned with a facet of the second waveguide. The amplifier waveguide is configured to receive a light signal from the first waveguide and guide the light signal such that the second waveguide receives the light signal from the amplifier waveguide. The amplifier chip is constructed such that an angle between a direction that the light signal travels when entering the amplifier waveguide and a direction that the light signal travels when exiting the amplifier waveguide is less than 180°.

BRIEF DESCRIPTION OF THE FIGURES

FIG. 10A illustrates an example of a processing unit.

FIG. 10B provides a schematic of electronics that are suitable for use with a processing unit constructed according to FIG. 10A.

FIG. 11C is a topview of the system.

FIG. 11D is a cross section of the system shown in FIG. 11C taken through a waveguide on the LIDAR chip and the amplifier waveguide on the amplifier chip.

DESCRIPTION

A LIDAR chip generates and transmits a LIDAR output signal. The LIDAR chip includes a utility waveguide that carries an outgoing LIDAR signal. The system also includes an amplifier that has an amplifier waveguide with a first facet and a second facet. The amplifier is positioned on the LIDAR chip such that the first facet is optically aligned with a facet of the utility waveguide but the second facet is not optically aligned with any waveguide on the LIDAR chip.

The amplifier waveguide receives the outgoing LIDAR signal from the utility waveguide and amplifies the power of the outgoing LIDAR signal as the amplifier waveguide carries the outgoing LIDAR signal from the first facet to the second facet. The outgoing LIDAR signal passes through the second facet and travels away from the LIDAR chip as a LIDAR output signal. In some instances, the LIDAR output signal also travels away from the LIDAR system and serves as a system output signal. In other instances, a system output signal travels away from the LIDAR system and includes or consists of light from the LIDAR output signal. While traveling away from the LIDAR system, the system output signal can be reflected by an object. The reflected light signal includes LIDAR data. All or a portion of the reflected light returns to the amplifier waveguide as a LIDAR input signal. The LIDAR input signal can be amplified as the amplifier waveguide carries the LIDAR input signal from the second facet to the first facet. The utility waveguide receives the amplified LIDAR input signal for further processing by the LIDAR chip. In this configuration, the LIDAR output signals are amplified as they leave the LIDAR chip and the LIDAR output signals are amplified as they enter the LIDAR chip. Accordingly, the power of the LIDAR output signals and the LIDAR input signals is increased.

Since the amplifier waveguide is optically aligned with only one waveguide rather than two waveguides, the coupling losses that occur at waveguide interfaces are reduced. Additionally, the inaccuracies that result from concurrently aligning the amplifier waveguide with two other waveguides are reduced. Further, when an amplifier waveguide is concurrently aligned with two other waveguides, there is a gap between the amplifier waveguide and the other waveguides in order to prevent damage to the waveguides during placement of the amplifier on the LIDAR chip. The coupling loss of the waveguide interface increases for wider gaps. However, when there is only one waveguide interface, the amplifier waveguide can be positioned as close to the chip waveguide as the assembly tolerance allows. As a result, the amplifier can increase the power of LIDAR input signal and/or LIDAR output signals while reducing power losses.

Figure 1:
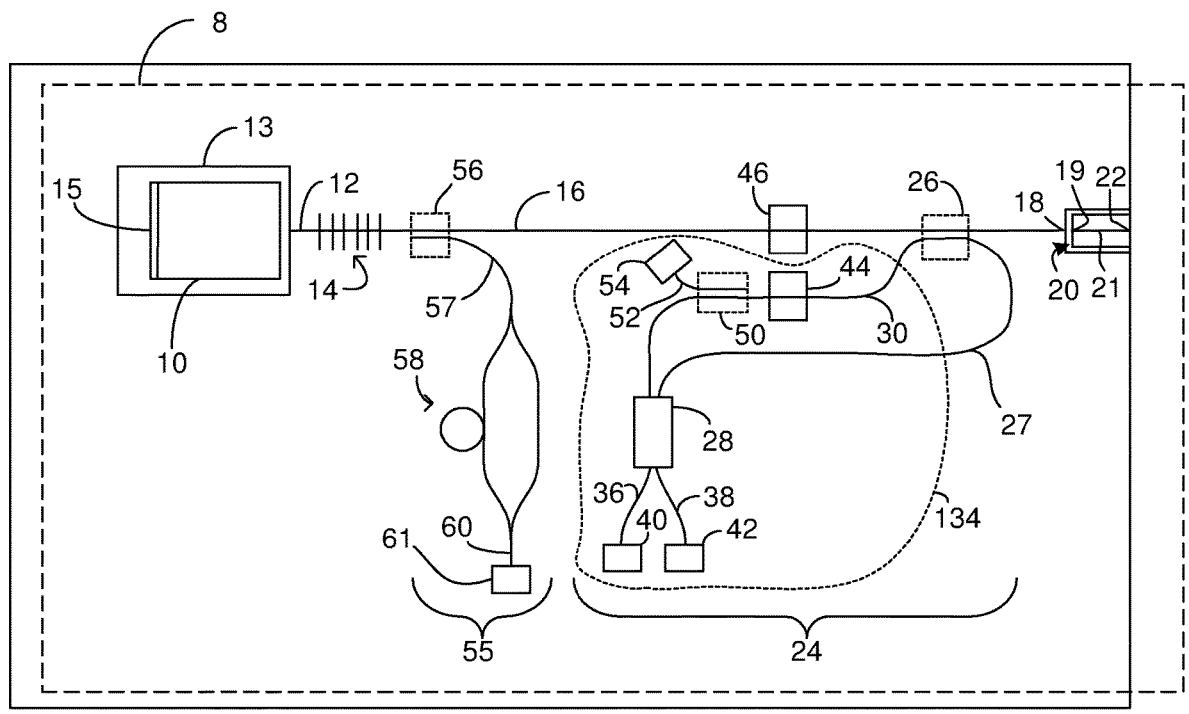
FIG. 1 is a top view of a LIDAR chip.

FIG. 1 is a topview of a LIDAR chip that includes a LIDAR assembly 8 that is configured to generate one or more LIDAR output signals and to use each of the LIDAR output signals to generate light signals and/or electrical signals that include LIDAR data (distance and/or radial velocity between the source of the LIDAR output signal and a reflecting object). The LIDAR assembly 8 includes a laser cavity. The laser cavity includes a light source 10 that can include or consist of a gain medium (not shown) for a laser. The chip also includes a cavity waveguide 12 that receives a light signal from the light source 10. The light source can be positioned in a recess 13 so a facet of the light source is optically aligned with a facet of the cavity waveguide 12 to allow the light source and cavity waveguide 12 to exchange light signals. The cavity waveguide 12 carries the light signal to a partial return device 14. The illustrated partial return device 14 is an optical grating such as a Bragg grating. However, other partial return devices 14 can be used; for instance, mirrors can be used in conjunction with echelle gratings and arrayed waveguide gratings.

The partial return device 14 returns a return portion of the light signal to the cavity waveguide 12 as a return signal. For instance, the cavity waveguide 12 returns the return signal to the light source 10 such that the return portion of the light signal travels through the gain medium. The light source 10 is configured such that at least a portion of the return signal is added to the light signal that is received at the cavity waveguide 12. For instance, the light source 10 can include a highly, fully, or partially reflective device 15 that reflects the return signal received from the gain medium back into the gain medium. As a result, light can resonate between the partial return device 14 and the reflective device 15 so as to form a Distributed Bragg Reflector (DBR) laser cavity. A DBR laser cavity has an inherently narrow-linewidth and a longer coherence length than DFB lasers and accordingly improves performance when an object reflecting a system output signal is located further away from the LIDAR system.

The partial return device 14 passes a portion of the light signal received from the cavity waveguide 12 to a utility waveguide 16 included on the chip. The portion of the light signal that the utility waveguide 16 receives from the partial return device 14 serves as the output of the laser cavity. The output of the laser cavity serves as an outgoing LIDAR signal on the utility waveguide 16. The utility waveguide 16 terminates at a facet 18 and carries the outgoing LIDAR signal to the facet 18.

The facet 18 is optically aligned with a first facet 19 of an optical amplifier 20. The optical amplifier includes an amplifier waveguide 21 that terminates at a second facet 22. The outgoing LIDAR signal passes through the facet 18 of the utility waveguide 16, through the first facet 19, and is received in the amplifier waveguide 21. The amplifier waveguide 21 carries the outgoing LIDAR signal to the second facet 22. The second facet 22 can be positioned such that the outgoing LIDAR signal traveling through the second facet 22 exits the chip and serves as a LIDAR output signal. For instance, the second facet 22 can be positioned at or near an edge of the LIDAR chip so the outgoing LIDAR signal traveling through the second facet 22 exits the chip and serves as a LIDAR output signal.

The LIDAR output signal travels away from the LIDAR chip. In some instances, the LIDAR output signal also travels away from the LIDAR system and accordingly serves as a system output signal. In other instances, a system output signal travels away from the LIDAR system and includes or consists of light from the LIDAR output signal. While traveling away from the LIDAR system, the system output signal can be reflected by an object. The reflected light signal includes LIDAR data. All or a portion of the reflected light signal travels away from the objects. At least a portion of the reflected light returns to the second facet 22 of the amplifier 20 as a LIDAR input signal. Accordingly, a portion of the reflected signal can enter the amplifier waveguide 21 through the second facet 22. The amplifier waveguide 21 carries the LIDAR input signal to the first facet 19. The LIDAR input signal passes through the first facet 19 of the amplifier waveguide 21, through the facet 18 of the utility waveguide 16, and is received in the utility waveguide 16 where it can serve as an incoming LIDAR signal. The amplifier can be operated so as to amplify the LIDAR output signals and/or LIDAR input signals.

The LIDAR chip includes a data branch 24 where the optical signals that carry the LIDAR data are generated. The data branch includes an optical coupler 26 that moves a portion of the light signals from the utility waveguide 16 into the data branch. For instance, an optical coupler 26 couples a portion of the outgoing LIDAR signal from the utility waveguide 16 onto a reference waveguide 27 as a reference signal. The reference waveguide 27 carries the reference signal to a light-combining component 28.

The optical coupler 26 also couples a portion of the incoming LIDAR signal from the utility waveguide 16 onto a comparative waveguide 30 as a comparative signal. The comparative signal includes at least a portion of the light from the incoming LIDAR signal (LIDAR input signal). The comparative signal can exclude light from the reference light signal. The comparative waveguide 30 carries the comparative signal to the light-combining component 28.

The illustrated optical coupler 26 is a result of positioning the utility waveguide 16 sufficiently close to the reference waveguide 27 and the comparative waveguide 30 that light from the utility waveguide 16 is coupled into the reference waveguide 27 and the comparative waveguide 30; however, other signal tapping components can be used to move a portion of the of the light signals from the utility waveguide 16 onto the reference waveguide 27 and the comparative waveguide 30. Examples of suitable signal tapping components include, but are not limited to, y-junctions, multi-mode interference couplers (MMIs), and integrated optical circulators.

The light-combining component 28 combines the comparative signal and the reference signal into a composite signal. The reference signal includes light from the outgoing LIDAR signal. For instance, the reference signal can serve as a sample of the outgoing LIDAR signal. The reference signal can exclude light from the LIDAR output signal and incoming LIDAR signal (LIDAR input signal). In contrast, the comparative signal includes light from the incoming LIDAR signal (LIDAR input signal). For instance, the comparative signal can serve as a sample of the incoming LIDAR signal. Accordingly, the comparative signal includes or consists of light that has been reflected by an object located outside of the LIDAR system while the light in the reference signal has not been reflected by any object located outside of the LIDAR system. When the chip and the reflecting object are moving relative to one another, the comparative signal and the reference signal have different frequencies due to the Doppler effect. As a result, beating occurs between the comparative signal and the reference signal.

The light-combining component 28 also splits the resulting composite sample signal onto a first detector waveguide 36 and a second detector waveguide 38. The first detector waveguide 36 carries a first portion of the composite sample signal to a first light sensor 40 that converts the first portion of the composite sample signal to a first electrical signal. The second detector waveguide 38 carries a second portion of the composite sample signal to a second light sensor 42 that converts the second portion of the composite sample signal to a second electrical signal. Examples of suitable light sensors include germanium photodiodes (PDs), and avalanche photodiodes (APDs).

The light combining component 28, the first light sensor 40 and the second light sensor 42 can be connected as a balanced photodetector that outputs an electrical data signal. For instance, the light combining component 28, the first light sensor 40 and the second light sensor 42 can be connected such that the DC components of the signal photocurrents cancel, improving detection sensitivity. Suitable methods for connecting the first light sensor 40 and the second light sensor 42 as balanced photodetectors includes connecting the first light sensor 40 and the second light sensor 42 in series. In one example, the first light sensor 40 and the second light sensor 42 are both avalanche photodiodes connected in series. Balanced photodetection is desirable for detection of small signal fluctuations.

An example of a suitable light-combining component 28 is a Multi-Mode Interference (MMI) device such as a 2×2 MIMI device. Other suitable light-combining components 28 include, but are not limited to, adiabatic splitters, and directional coupler. In some instances, the functions of the illustrated light-combining component 28 are performed by more than one optical component or a combination of optical components.

A single light sensor can replace the first light sensor 40 and the second light sensor 42 and can output the data signal. When a single light sensor replaces the first light sensor 40 and the second light sensor 42, the light-combining component 28 need not include light-splitting functionality. As a result, the illustrated light light-combining component 28 can be a 2×1 light-combining component rather than the illustrated 2×1 light-combining component. For instance, the illustrated light light-combining component can be a 2×1 MMI device. In these instances, the chip includes a single detector waveguide that carries the composite sample signal to the light sensor.

The data branch includes a data optical attenuator 44 positioned along the comparative waveguide 30 such that the data optical attenuator 44 can be operated so as to attenuate the comparative signal on the comparative waveguide 30. The chip also includes an output optical attenuator 46 positioned along the utility waveguide 16 such that the output optical attenuator 46 can be operated so as to attenuate the outgoing LIDAR signal on the utility waveguide 16. Suitable attenuators for the data optical attenuator 44 and/or the output optical attenuator 46 are configured to attenuate intensity of a light signal. Examples of a suitable attenuator configured to attenuate intensity of a light signal include carrier-injection based PIN diodes, electro-absorption modulators, and Mach-Zehnder (MZ) modulators.

The chip also includes a sampling directional coupler 50 that couples a portion of the comparative signal from the comparative waveguide 30 onto a sampling waveguide 52. The coupled portion of the comparative signal serves as a sampling signal. The sampling waveguide 52 carries the sampling signal to a sampling light sensor 52. Although FIG. 1 illustrates a sampling directional coupler 50 moving a portion of the comparative signal onto the sampling waveguide 52, other signal tapping components can be used to move a portion of the comparative signal from the comparative waveguide 30 onto the sampling waveguide 52. Examples of suitable signal tapping components include, but are not limited to, y-junctions, and MMIs.

The chip includes a control branch 55 for controlling operation of the laser cavity. The control branch includes a directional coupler 56 that moves a portion of the outgoing LIDAR signal from the utility waveguide 16 onto a control waveguide 57. The coupled portion of the outgoing LIDAR signal serves as a tapped signal. Although FIG. 1 illustrates a directional coupler 56 moving portion of the outgoing LIDAR signal onto the control waveguide 57, other signal-tapping components can be used to move a portion of the outgoing LIDAR signal from the utility waveguide 16 onto the control waveguide 57. Examples of suitable signal tapping components include, but are not limited to, y-junctions, and MMIs.

The control waveguide 57 carries the tapped signal to an interferometer 58 that splits the tapped signal and then re-combines the different portions of the tapped signal with a phase differential between the portions of the tapped signal. The illustrated interferometer 58 is a Mach-Zehnder interferometer; however, other interferometers can be used.

The interferometer 58 outputs a control light signal on an interferometer waveguide 60. The interferometer waveguide 60 carries the control light signal to a control light sensor 61 that converts the control light signal to an electrical signal that serves as an electrical control signal. The interferometer signal has an intensity that is a function of the frequency and/or change in frequency of the outgoing LIDAR signal. For instance, a Mach-Zehnder interferometer will output a sinusoidal control light signal with a fringe pattern. Changes to the frequency of the outgoing LIDAR signal will cause changes to the frequency of the control light signal. Accordingly, the frequency of the electrical control signal output from the control light sensor 61 is a function of the frequency of the outgoing LIDAR signal. Other detection mechanisms can be used in place of the control light sensor 61. For instance, the control light sensor 61 can be replaced with a balanced photodetector arranged as the light combining component 28, the first light sensor 40 and the second light sensor 42.

Electronics 62 can operate one or more components on the chip. For instance, the electronics 62 can be in electrical communication with and control operation of the light source 10, the amplifier 20, the data optical attenuator 44, output optical attenuator 46, the first light sensor 40, the second light sensor 42, the sampling light sensor 54, and the control light sensor 61. Although the electronics 62 are shown off the chip, all or a portion of the electronics can be included on the chip. For instance, the chip can include electrical conductors that connect the first light sensor 40 in series with the second light sensor 42.

During operation of the chip, the electronics 62 operate the light source 10 such that the laser cavity outputs the outgoing LIDAR signal. The electronics 62 then operate the chip through a series of cycles where each cycle generates LIDAR data for a sample region in a field of view. During each cycle, the data signal is sampled multiple times. During each of the samples, the electronics tune the frequency of the outgoing LIDAR signal. As will be described in more detail below, the electronics can employ output from the control branch in order to control the frequency of the outgoing LIDAR signal such that the frequency of the outgoing LIDAR signal as a function of time is known to the electronics. In some instance, a cycle includes at least a first sample and a second sample. During the first sample, the electronics 62 can increase the frequency of the outgoing LIDAR signal and during a second sample the electronics 62 can decrease the frequency of the outgoing LIDAR signal. For instance, the laser cavity can be configured to output an outgoing LIDAR signal (and accordingly a LIDAR output signal) with a wavelength of 1550 nm. During the first sample, the electronics 62 can increase the frequency of the outgoing LIDAR signal (and accordingly a LIDAR output signal) such that the wavelength decreases from 1550 nm to 1459.98 nm followed by decreasing the frequency of the outgoing LIDAR signal such that the wavelength increases from 1459.98 nm to 1550 nm.

When the outgoing LIDAR signal frequency is increased during the first sample, the LIDAR output signal travels away from the chip and then returns to the chip as a LIDAR input signal. A portion of the LIDAR input signal becomes the comparative signal. During the time that the LIDAR output signal and the LIDAR input signal are traveling between the chip and a reflecting object, the frequency of the outgoing LIDAR signal continues to increase. Since a portion of the outgoing LIDAR signal becomes the reference signal, the frequency of the reference signal continues to increase. As a result, the comparative signal enters the light-combining component with a lower frequency than the reference signal concurrently entering the light-combining component. Additionally, the further the reflecting object is located from the chip, the more the frequency of the reference signal increases before the LIDAR input signal returns to the chip. Accordingly, the larger the difference between the frequency of the comparative signal and the frequency of the reference signal, the further the reflecting object is from the chip. As a result, the difference between the frequency of the comparative signal and the frequency of the reference signal is a function of the distance between the chip and the reflecting object.

For the same reasons, when the outgoing LIDAR signal frequency is decreased during the second sample, the comparative signal enters the light-combining component with a higher frequency than the reference signal concurrently entering the light-combining component and the difference between the frequency of the comparative signal and the frequency of the reference signal during the second sample is also function of the distance between the LIDAR system and the reflecting object.

In some instances, the difference between the frequency of the comparative signal and the frequency of the reference signal can also be a function of the Doppler effect because relative movement of the LIDAR system and reflecting object can also affect the frequency of the comparative signal. For instance, when the chip is moving toward or away from the reflecting object and/or the reflecting object is moving toward or away from the chip, the Doppler effect can affect the frequency of the comparative signal. Since the frequency of the comparative signal is a function of the speed the reflecting object is moving toward or away from the chip and/or the speed the chip is moving toward or away from the reflecting object, the difference between the frequency of the comparative signal and the frequency of the reference signal is also a function of the speed the reflecting object is moving toward or away from the chip and/or the speed the chip is moving toward or away from the reflecting object. Accordingly, the difference between the frequency of the comparative signal and the frequency of the reference signal is a function of the distance between the chip and the reflecting object and is also a function of the Doppler effect.

The composite sample signal and the data signal each effectively compares the comparative signal and the reference signal. For instance, since the light-combining component combines the comparative signal and the reference signal and these signals have different frequencies, there is beating between the comparative signal and reference signal. Accordingly, the composite sample signal and the data signal have a beat frequency related to the frequency difference between the comparative signal and the reference signal and the beat frequency can be used to determine the difference in the frequency of the comparative signal and the reference signal. A higher beat frequency for the composite sample signal and/or the data signal indicates a higher differential between the frequencies of the comparative signal and the reference signal. As a result, the beat frequency of the data signal is a function of the distance between the chip and the reflecting object and is also a function of the Doppler effect.

As noted above, the beat frequency is a function of two unknowns; the distance between the chip and the reflecting object and the relative velocity of the chip and the reflecting object (i.e., the contribution of the Doppler effect). The change in the frequency difference between the comparative signal and the reference signal ($\Delta f$) is given by $\Delta f = 2 \Delta v f / c$ where f is the frequency of the LIDAR output signal and accordingly the reference signal, $\Delta v$ is the relative velocity of the chip and the reflecting object and c is the speed of light in air. The use of multiple different samples permits the electronics 62 to resolve the two unknowns. For instance, the beat frequency determined for the first sample is related to the unknown distance and Doppler contribution and the beat frequency determined for the second sample is also related to the unknown distance and Doppler contribution. The availability of the two relationships allows the electronics 62 to resolve the two unknowns. Accordingly, the distance between the chip and the reflecting object can be determined without influence from the Doppler effect. Further, in some instances, the electronics 62 use this distance in combination with the Doppler effect to determine the velocity of the reflecting object toward or away from the chip.

In instances where the relative velocity of target and source is zero or very small, the contribution of the Doppler effect to the beat frequency is essentially zero. In these instances, the Doppler effect does not make a substantial contribution to the beat frequency and the electronics 62 can take only the first sample to determine the distance between the chip and the reflecting object.

During operation, the electronics 62 can adjust the frequency of the outgoing LIDAR signal in response to the electrical control signal output from the control light sensor 61. As noted above, the magnitude of the electrical control signal output from the control light sensor 61 is a function of the frequency of the outgoing LIDAR signal. Accordingly, the electronics 62 can adjust the frequency of the outgoing LIDAR signal in response to the magnitude of the control. For instance, while changing the frequency of the outgoing LIDAR signal during one of the samples, the electronics 62 can have a range of suitable values for the electrical control signal magnitude as a function of time. At multiple different times during a sample, the electronics 62 can compare the electrical control signal magnitude to the range of values associated with the current time in the sample. If the electrical control signal magnitude indicates that the frequency of the outgoing LIDAR signal is outside the associated range of electrical control signal magnitudes, the electronics 62 can operate the light source 10 so as to change the frequency of the outgoing LIDAR signal so it falls within the associated range. If the electrical control signal magnitude indicates that the frequency of the outgoing LIDAR signal is within the associated range of electrical control signal magnitudes, the electronics 62 do not change the frequency of the outgoing LIDAR signal.

During operation, the electronics 62 can adjust the level of attenuation provided by the output optical attenuator 46 in response to the sampling signal from the sampling light sensor 52. For instance, the electronics 62 operate the output optical attenuator 46 so as to increase the level of attenuation in response to the magnitude of the sampling signal being above a first signal threshold and/or decrease the magnitude of the power drop in response to the magnitude of the sampling signal being below a second signal threshold.

In some instances, the electronics 62 adjust the level of attenuation provided by the output optical attenuator 46 to prevent or reduce the effects of back-reflection on the performance of the laser cavity. For instance, the first signal threshold and/or the second signal threshold can optionally be selected to prevent or reduce the effects of back-reflection on the performance of the laser cavity. Back reflection occurs when a portion of the LIDAR input signal returns to the laser cavity as a returned LIDAR signal. In some instances, on the order of 50% of the LIDAR input signal that passes through the facet 18 returns to the laser cavity. The returned LIDAR signal can affect performance of the laser cavity when the power of the returned LIDAR signal entering the partial return device 14 does not decrease below the power of the outgoing LIDAR signal exiting from the partial return device 14 ("power drop") by more than a minimum power drop threshold. In the illustrated chip, the minimum power drop threshold can be around 35 dB (0.03%). Accordingly, the returned LIDAR signal can affect the performance of the laser cavity when the power of the returned LIDAR signal entering the partial return device 14 is not more than 35 dB below the power of the outgoing LIDAR signal exiting from the partial return device 14.

The electronics 62 can operate the output optical attenuator 46 so as to reduce the effect of low power drops, e.g. when the target object is very close or highly reflective or both. As is evident from FIG. 1, operation of the output optical attenuator 46 so as to increase the level of attenuation reduces the power of the returned LIDAR signal entering the partial return device 14 and also reduces the power of the returned outgoing LIDAR signal at a location away from the partial return device 14. Since the output optical attenuator 46 is located apart from the partial return device 14, the power of the outgoing LIDAR signal exiting from the partial return device 14 is not directly affected by the operation of the output optical attenuator 46. Accordingly, the operation of the output optical attenuator 46 so as to increase the level of attenuation increases the level of the power drop. As a result, the electronics can employ the optical attenuator 46 so as to tune the power drop.

Additionally, the magnitude of the sampling signal is related to the power drop. For instance, the magnitude of the sampling signal is related to the power of the comparative signal as is evident from FIG. 1. Since the comparative signal is a portion of the LIDAR input signal, the magnitude of the sampling signal is related to the power of the LIDAR input signal. This result means the magnitude of the sampling signal is also related to the power of the returned LIDAR signal because the returned LIDAR signal is a portion of the LIDAR input signal. Accordingly, the magnitude of the sampling signal is related to the power drop.

Since the magnitude of the sampling signal is related to the power drop, the electronics 62 can use the magnitude of the sampling signal to operate the output optical attenuator so as to keep the magnitude of the comparative signal power within a target range. For instance, the electronics 62 can operate the output optical attenuator 46 so as to increase the magnitude of the power drop in response to the sampling signal indicating that the magnitude of power drop is at or below a first threshold and/or the electronics 62 can operate the output optical attenuator 46 so as to decrease the magnitude of the power drop in response to the sampling signal indicating that the magnitude of power drop is at or above a second threshold. In some instances, the first threshold is greater than or equal to the minimum power drop threshold. In one example, the electronics 62 operate the output optical attenuator 46 so as to increase the magnitude of the power drop in response to the magnitude of the sampling signal being above a first signal threshold and/or decrease the magnitude of the power drop in response to the magnitude of the sampling signal being below a second signal threshold. The identification of the value(s) for one, two, three, or four variables selected from the group consisting of the first threshold, the second threshold, the first signal threshold, and the second signal threshold can be determined from calibration of the optical chip during set-up of the LIDAR chip system.

Light sensors can become saturated when the power of the composite light signal exceeds a power threshold. When a light sensor becomes saturated, the magnitude of the data signal hits a maximum value that does not increase despite additional increases in the power of the composite light signal above the power threshold. Accordingly, data can be lost when the power of the composite light signal exceeds a power threshold. During operation, the electronics 62 can adjust the level of attenuation provided by the data optical attenuator 44 so the power of the composite light signal is maintained below a power threshold.

As is evident from FIG. 1, the magnitude of the sampling signal is related to the power of the comparative signal. Accordingly, the electronics 62 can operate the data optical attenuator 44 in response to output from the sampling signal. For instance, the electronics 62 can operate the data optical attenuator so as to increase attenuation of the comparative signal when the magnitude of the sampling signal indicates the power of the comparative signal is above an upper comparative signal threshold and/or can operate the data optical attenuator so as to decrease attenuation of the comparative signal when the magnitude of the sampling signal indicates the power of the comparative signal is below a lower comparative signal threshold. For instance, in some instances, the electronics 62 can increase attenuation of the comparative signal when the magnitude of the sampling signal is at or above an upper comparative threshold and/or the electronics 62 decrease attenuation of the comparative signal when the magnitude of the sampling signal is at or below an upper comparative signal threshold.

Figure 2:
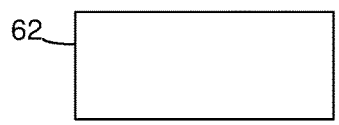
FIG. 2 is a cross-section of a LIDAR chip according to FIG. 1 constructed from a silicon-on-insulator wafer.
Figure 2:
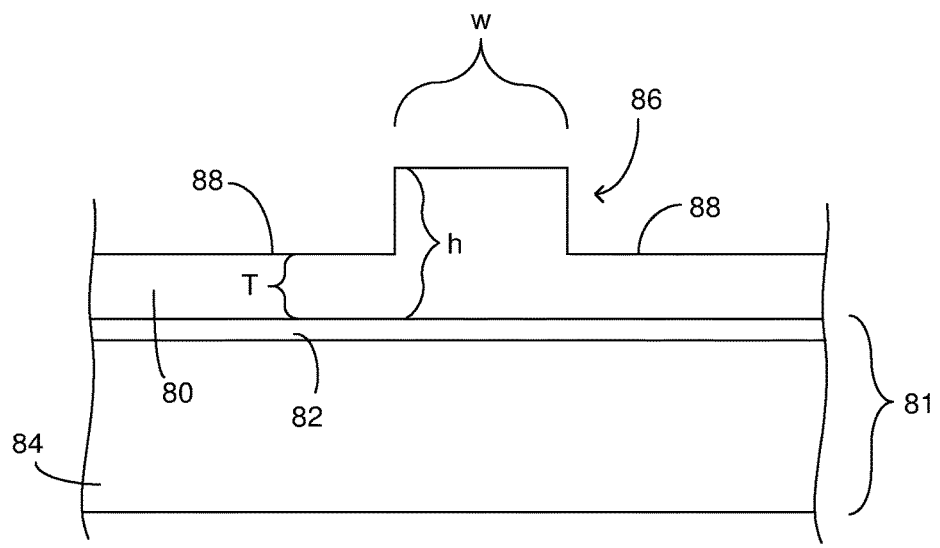

As noted above, the electronics 62 can adjust the level of attenuation provided by the output optical attenuator 46 in response to the sampling signal. The electronics 62 can adjust the level of attenuation provided by the data optical attenuator 44 in response to the sampling signal in addition or as an alternative to adjusting the level of attenuation provided by the output optical attenuator 46 in response to the sampling signal Suitable platforms for the chip include, but are not limited to, silica, indium phosphide, and silicon-on-insulator wafers. FIG. 2 is a cross-section of portion of a chip constructed from a silicon-on-insulator wafer. A silicon-on-insulator (SOI) wafer includes a light-transmitting medium 80 positioned on a base 81 that includes a buried layer 82 on a substrate 84. The buried layer 82 is between the light-transmitting medium 80 and the substrate 84. In a silicon-on-insulator wafer, the buried layer is silica while the substrate and the light-transmitting medium are silicon. The substrate of an optical platform such as an SOI wafer can serve as the base for the entire chip. For instance, the optical components shown in FIG. 1 can be positioned on or over the top and/or lateral sides of the substrate.

The portion of the chip illustrated in FIG. 2 includes a waveguide construction that is suitable for use with chips constructed from silicon-on-insulator wafers. A ridge 86 of the light-transmitting medium extends away from slab regions 88 of the light-transmitting medium. The light signals are constrained between the top of the ridge and the buried oxide layer.

The dimensions of the ridge waveguide are labeled in FIG. 2. For instance, the ridge has a width labeled w and a height labeled h. A thickness of the slab regions is labeled T. For LIDAR applications, these dimensions are more important than other applications because of the need to use higher levels of optical power than are used in other applications. The ridge width (labeled w) is greater than 1 μm and less than 4 μm, the ridge height (labeled h) is greater than 1 μm and less than 4 μm, the slab region thickness is greater than 0.5 μm and less than 3 μm. These dimensions can apply to straight or substantially straight portions of the waveguide, curved portions of the waveguide and tapered portions of the waveguide(s). Accordingly, these portions of the waveguide will be single mode. However, in some instances, these dimensions apply to straight or substantially straight portions of a waveguide while curved portions of the waveguide and/or tapered portions of the waveguide have dimensions outside of these ranges. For instance, the tapered portions of the utility waveguide 16 illustrated in FIG. 1 can have a width and/or height that is >4 μm and can be in a range of 4 μm to 12 μm. Additionally or alternately, curved portions of a waveguide can have a reduced slab thickness in order to reduce optical loss in the curved portions of the waveguide. For instance, a curved portion of a waveguide can have a ridge that extends away from a slab region with a thickness greater than or equal to 0.0 μm and less than 0.5 μm. While the above dimensions will generally provide the straight or substantially straight portions of a waveguide with a single-mode construction, they can result in the tapered section(s) and/or curved section(s) that are multi-mode. Coupling between the multi-mode geometry to the single mode geometry can be done using tapers that do not substantially excite the higher order modes. Accordingly, the waveguides can be constructed such that the signals carried in the waveguides are carried in a single mode even when carried in waveguide sections having multi-mode dimensions. The waveguide construction of FIG. 2 is suitable for all or a portion of the waveguides selected from the group consisting of the cavity waveguide 12, utility waveguide 16, reference waveguide 27, comparative waveguide 30, first detector waveguide 36, second detector waveguide 38, sampling waveguide 52, control waveguide 57, and interferometer waveguide 60. The waveguide construction disclosed in the context of FIG. 2 is also suitable for steering waveguides that will be disclosed below.

The light source 10 that is interfaced with the utility waveguide 16 can be a gain element that is a component separate from the chip and then attached to the chip. For instance, the light source 10 can be a gain element that is attached to the chip using a flip-chip arrangement.

Use of flip-chip arrangements is suitable when the light source 10 is to be interfaced with a ridge waveguide on a chip constructed from silicon-on-insulator wafer. Examples of suitable interfaces between flip-chip gain elements and ridge waveguides on chips constructed from silicon-on-insulator wafer can be found in U.S. Pat. No. 9,705,278, issued on Jul. 11, 2017 and in U.S. Pat. No. 5,991,484 issued on Nov. 23, 1999; each of which is incorporated herein in its entirety. The constructions are suitable for use as the light source 10. When the light source 10 is a gain element, the electronics 62 can change the frequency of the outgoing LIDAR signal by changing the level of electrical current applied to through the gain element.

The attenuators can be a component that is separate from the chip and then attached to the chip. For instance, the attenuator can be included on an attenuator chip that is attached to the chip in a flip-chip arrangement. The use of attenuator chips is suitable for all or a portion of the attenuators selected from the group consisting of the data attenuator and the control attenuator.

As an alternative to including an attenuator on a separate component, all or a portion of the attenuators can be integrated with the chip. For instance, examples of attenuators that are interfaced with ridge waveguides on a chip constructed from a silicon-on-insulator wafer can be found in U.S. Pat. No. 5,908,305, issued on Jun. 1, 1999; each of which is incorporated herein in its entirety. The use of attenuators that are integrated with the chip are suitable for all or a portion of the light sensors selected from the group consisting of the data attenuator and the control attenuator.

Light sensors that are interfaced with waveguides on a chip can be a component that is separate from the chip and then attached to the chip. For instance, the light sensor can be a photodiode, or an avalanche photodiode. Examples of suitable light sensor components include, but are not limited to, InGaAs PIN photodiodes manufactured by Hamamatsu located in Hamamatsu City, Japan, or an InGaAs APD (Avalanche Photo Diode) manufactured by Hamamatsu located in Hamamatsu City, Japan. These light sensors can be centrally located on the chip as illustrated in FIG. 1. Alternately, all or a portion the waveguides that terminate at a light sensor can terminate at a facet 18 located at an edge of the chip and the light sensor can be attached to the edge of the chip over the facet 18 such that the light sensor receives light that passes through the facet 18. The use of light sensors that are a separate component from the chip is suitable for all or a portion of the light sensors selected from the group consisting of the first light sensor 40, the second light sensor 42, the sampling light sensor 52, and the control light sensor 61.

As an alternative to a light sensor that is a separate component, all or a portion of the light sensors can be integrated with the chip. For instance, examples of light sensors that are interfaced with ridge waveguides on a chip constructed from a silicon-on-insulator wafer can be found in Optics Express Vol. 15, No. 21, 13965-13971 (2007); U.S. Pat. No. 8,093,080, issued on Jan. 10, 2012; U.S. Pat. No. 8,242,432, issued Aug. 14, 2012; and U.S. Pat. No. 6,108,8472, issued on Aug. 22, 2000 each of which is incorporated herein in its entirety. The use of light sensors that are integrated with the chip are suitable for all or a portion of the light sensors selected from the group consisting of the first light sensor 40, the second light sensor 42, the sampling light sensor 52, and the control light sensor 61.

Construction of optical gratings that are integrated with a variety of optical device platforms are available. For instance, a Bragg grating can be formed in a ridge waveguides by forming grooves in the top of the ridge and/or in the later sides of the ridge.

Figure 3A:
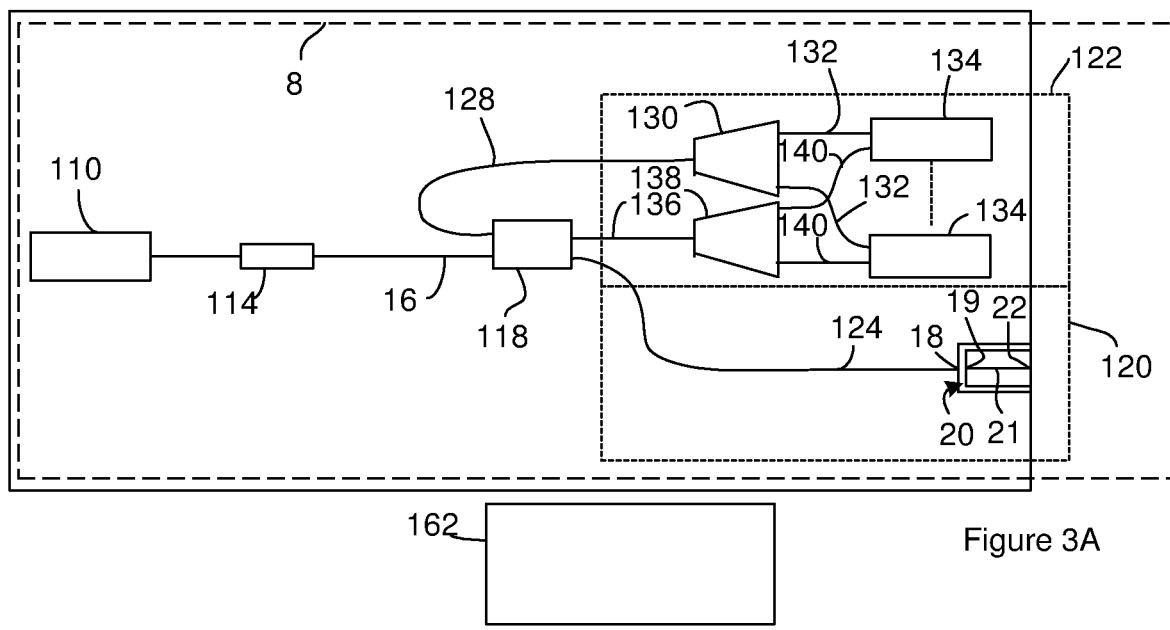
FIG. 3A is a schematic of a LIDAR system.

The LIDAR chip can be modified to generate one LIDAR output signal or multiple different LIDAR output signals. For instance, FIG. 3A is a schematic of the LIDAR chip of FIG. 1 modified to generate one or more different LIDAR output signals. The LIDAR chip includes a component assembly 8 with a light source 110 that outputs an outgoing LIDAR signal that includes one or more different channels that are each at a different wavelength. The wavelengths of the channels can be periodically spaced in that the wavelength increase from one channel to the next channel is constant or substantially constant. A suitable light source 110 for generating a single channel is disclosed in the context of FIG. 1 through FIG. 2. A suitable light source 110 for generating multiple channels with periodically spaced wavelengths includes, but is not limited to, comb lasers, multiple single wavelength lasers multiplexed into to single optical waveguide, sources such as that described in U.S. patent application Ser. No. 11/998,846, filed on Nov. 30, 2017, grated U.S. Pat. No. 7,542,641, entitled "Multi-Channel Optical Device," and incorporated herein in its entirety.

The utility waveguide 16 receives the outgoing LIDAR signal from the light source 110. A modulator 114 is optionally positioned along the utility waveguide 16. The modulator 114 is configured to modulate the power of the outgoing LIDAR signal and accordingly the resulting LIDAR output signal(s). The electronics 62 can operate the modulator 114. As a result, the electronics 62 can modulate the power of the outgoing LIDAR signal and accordingly the LIDAR output signal(s). Suitable modulators 114 include, but are not limited to, PIN diode carrier injection devices, Mach-Zehnder modulator devices, and electro-absorption modulator devices. When the modulator 114 is constructed on a silicon-on-insulator platform, a suitable modulator is disclosed in U.S. patent application Ser. No. 617,810, filed on Sep. 21, 1993, entitled Integrated Silicon PIN Diode Electro-Optic Waveguide, and incorporated herein in its entirety.

The utility waveguide 16 carries the outgoing LIDAR signal from the modulator 114 to a signal-directing component 118. The signal-directing component 118 can direct the outgoing LIDAR signal to a LIDAR branch 120 and/or a data branch 122. The LIDAR branch outputs LIDAR output signals and receives LIDAR input signals. The data branch processes the LIDAR input signals for the generation of LIDAR data (distance and/or radial velocity between the source of the LIDAR output signal and a reflecting object).

The LIDAR branch includes a LIDAR signal waveguide 124 that receives at least a portion of the outgoing LIDAR signal from the signal-directing component 118. The LIDAR signal waveguide 124 carries at least a portion of the outgoing LIDAR signal to a facet 18. The facet 18 is optically aligned with the first facet 19 of the optical amplifier 20. The optical amplifier includes an amplifier waveguide 21 that terminates at a second facet 22. The outgoing LIDAR signal passes through the facet 18 of the utility waveguide 16, through the first facet 19, and is received in the amplifier waveguide 21. The amplifier waveguide 21 carries the outgoing LIDAR signal to the second facet 22. The second facet 22 can be positioned such that the outgoing LIDAR signal traveling through the second facet 22 exits the chip and serves as a LIDAR output signal. For instance, the second facet 22 can be positioned at or near an edge of the LIDAR chip so the outgoing LIDAR signal traveling through the second facet 22 exits the chip. When the outgoing LIDAR signal includes multiple different channels at different wavelengths, the outgoing LIDAR signal can be separated into multiple LIDAR output signals that are each at a different wavelength (channel) and are directed to different sample regions in a field of view. The outgoing LIDAR signal can be separated into multiple LIDAR output signals by a wavelength-dispersive device such as an Optical Phased Array (OPA). In some instances, the LIDAR output signals travel away from the LIDAR system and serve as system output signals. In some instances, the LIDAR system output signals that travel away from the LIDAR system and include or consists of light from the LIDAR output signals and serve as system output signals. The system output signals can be reflected by a reflecting object (not shown) located outside of the LIDAR system. All or a portion of the reflected light returns to the amplifier 20 as an incoming LIDAR signal.

The LIDAR signal waveguide 124 carries the incoming LIDAR signal to the signal-directing component 118. The signal-directing component 118 directs the incoming LIDAR signal to the utility waveguide 16 and/or a comparative signal waveguide 128. The portion of the incoming LIDAR signal-directed to the comparative signal waveguide 128 serves a comparative incoming LIDAR signal.

The comparative signal waveguide 128 carries the comparative incoming LIDAR signal to a comparative demultiplexer 130. When the comparative light signal includes multiple channels, the comparative demultiplexer 130 divides the comparative incoming LIDAR signal into different comparative signals that each has a different wavelength. The comparative demultiplexer 130 outputs the comparative signals on different comparative waveguides 132. The comparative waveguides 132 each carry one of the comparative signals to different processing components 134.

The signal-directing component 118 is configured such that when the signal-directing component 118 directs at least a portion of the incoming LIDAR signal to the comparative waveguide 132, the signal-directing component 118 also directs at least a portion of the outgoing LIDAR signal to a reference signal waveguide 136. The portion of the outgoing LIDAR signal received by the reference signal waveguide 136 serves as a reference light signal.

The reference signal waveguide 136 carries the reference light signal to a reference demultiplexer 138. When the reference light signal includes multiple channels, the reference demultiplexer 138 divides the reference light signal into different reference signals that each has a different wavelength. The reference demultiplexer 138 outputs the reference signals on different reference waveguides 140. The reference waveguides 140 each carry one of the reference signals to a different one of the processing components 134.

The comparative waveguides 132 and the reference waveguides 140 are configured such that a comparative signal and the corresponding reference signal are received at the same processing component 134. For instance, the comparative waveguides 132 and the reference waveguides 140 are configured such that the comparative signal and the corresponding reference signal of the same wavelength are received at the same processing component 134.

As will be described in more detail below, the processing components 134 each combines a comparative signal with the corresponding reference signal to form a composite signal that carries LIDAR data for a sample region on the field of view. Accordingly, the composite signal can be processed so as to extract LIDAR data for the sample region.

The signal-directing component 118 can be an optical coupler. When the signal-directing component 118 is an optical coupler, the signal-directing component 118 directs a first portion of the outgoing LIDAR signal to the LIDAR signal waveguide 124 and a second portion of the outgoing LIDAR signal to the reference signal waveguide 136 and also directs a first portion of the incoming LIDAR signal to the utility waveguide 16 and a second portion of the incoming LIDAR signal to the comparative signal waveguide 128. Accordingly, the second portion of the incoming LIDAR signal can serve as the comparative incoming LIDAR signal and the second portion of the outgoing LIDAR signal can serve as the reference light signal.

The signal-directing component 118 can be an optical switch such as a cross-over switch. A suitable cross-over switch can be operated in a cross mode or a pass mode. In the pass mode, the outgoing LIDAR signal is directed to the LIDAR signal waveguide 124 and an incoming LIDAR signal would be directed to the utility waveguide 16. In the cross mode, the outgoing LIDAR signal is directed to the reference signal waveguide 136 and the incoming LIDAR signal is directed to the comparative signal waveguide 128. Accordingly, the incoming LIDAR signal or a portion of the incoming LIDAR signal can serve as the comparative light signal and the outgoing LIDAR signal or a portion of the outgoing LIDAR signal can serve as the reference light signal.

An optical switch such as a cross-over switch can be controlled by the electronics. For instance, the electronics can control operate the switch such that the switch is in the cross mode or a pass mode. When the LIDAR output signal is to be transmitted from the LIDAR system, the electronics operate the switch such that the switch is in the pass mode. When the LIDAR input signal is to be received by the LIDAR system, the electronics operate the switch such that the switch is in the cross-over mode. The use of a switch can provide lower levels of optical loss than are associated with the use of an optical coupler as the signal-directing component 118.

In the above descriptions of the operation of the signal-directing component 118, the comparative light signals and the reference light signals are concurrently directed to the data branch. As a result, the processing components 34 can each combine a comparative signal with the corresponding reference signal.

Light from a laser source is typically linearly polarized and hence the LIDAR output signal is also typically linearly polarized. Reflection from a target may change the angle of polarization of the returned light. Accordingly, the LIDAR input signal can include light of different linear polarities. For instance, a first portion of a LIDAR input signal can include light of a first linear polarization and a second portion of a LIDAR input signal can include light of a second linear polarization. The intensity of the resulting composite signals is proportional to the square of the cosine of the angle between the comparative and reference signal polarizations. If the angle is 90 degrees, the LIDAR data can be lost in the resulting composite signal. As a result, the LIDAR system can be modified to compensate for changes in polarization of the LIDAR output signal.

Figure 3B:
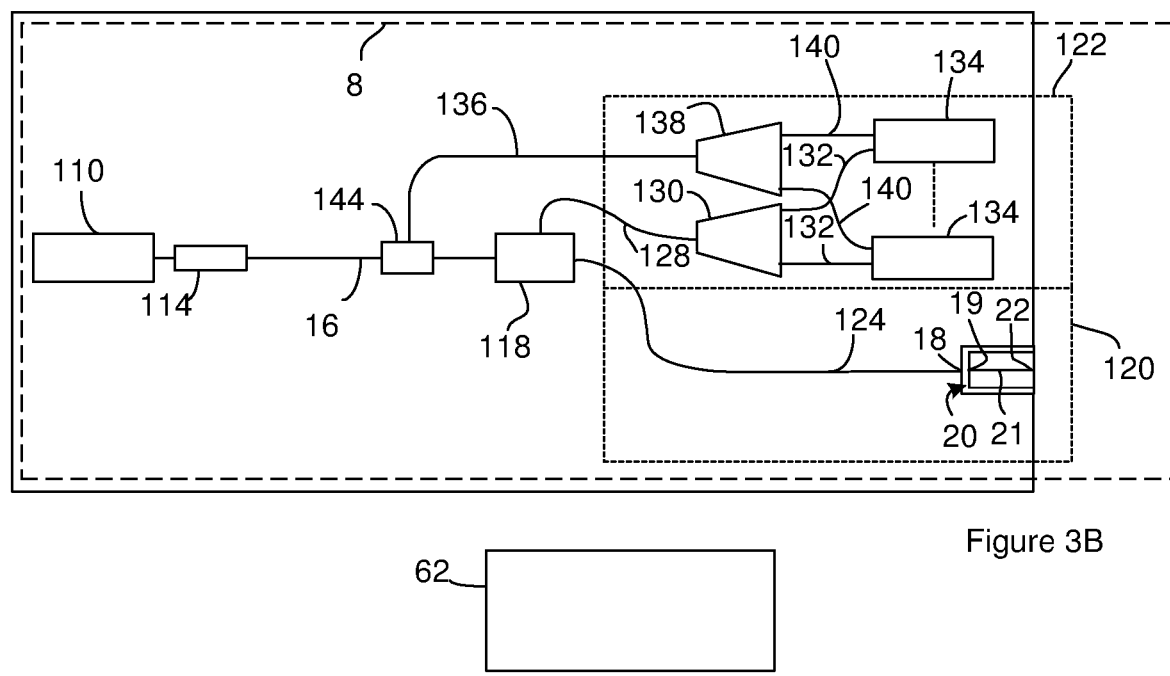
FIG. 3B is a schematic of another embodiment of a LIDAR system.

FIG. 3B illustrates the LIDAR system of FIG. 3A modified to include an optical circulator as the signal-directing component 118. The optical circulator is configured such that the outgoing LIDAR signal is directed to the LIDAR signal waveguide 124 and the incoming LIDAR signal is directed to the comparative signal waveguide 128. The comparative signal waveguide 128 carries the comparative incoming LIDAR signal to the comparative demultiplexer 130. Additionally, a tap component 144 is positioned along the utility waveguide 16. The tap component 144 is configured to tap off a first portion of the outgoing LIDAR signal such that the first portion of the outgoing LIDAR signal is received on the reference signal waveguide 136. The first portion of the outgoing LIDAR signal received by the reference signal waveguide 136 serves as the reference light signal. The reference signal waveguide 136 carries the reference light signal to the reference demultiplexer 138. Accordingly, the electronics can operate the LIDAR system of FIG. 3B as disclosed in the context of FIG. 3A. Suitable optical circulators include, but are not limited to, Faraday rotator based optical fiber circulators, and integrated optical circulators. Although the signal-directing component 118 of FIG. 3B is disclosed as an optical circulator, the signal-directing component 118 of FIG. 3B can be an optical coupler or optical switch.

Figure 4:
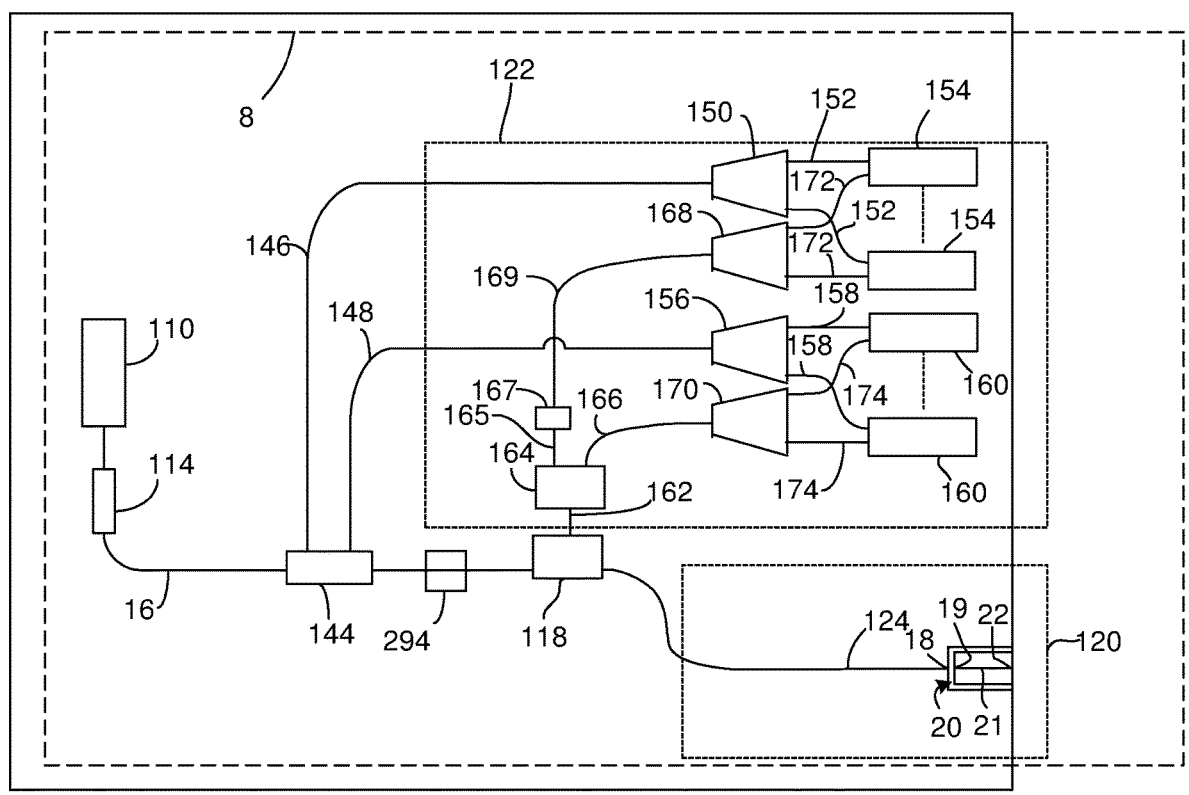
FIG. 4 is a schematic of another embodiment of a LIDAR system.
Figure 4:
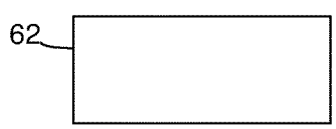

FIG. 4 is a schematic of the LIDAR system of FIG. 3A and/or FIG. 3B modified to compensate for changes in the polarization of the LIDAR output signal. A tap component 144 is positioned along the utility waveguide 16. The tap component 144 is configured to tap off a first portion of the outgoing LIDAR signal such that the first portion of the outgoing LIDAR signal is received on a first reference signal waveguide 146. The first portion of the outgoing LIDAR signal received by the first reference signal waveguide 146 serves as a first reference light signal. The tap component 144 is also configured to tap off a second portion of the outgoing LIDAR signal such that the second portion of the outgoing LIDAR signal is received on a second reference signal waveguide 148. The second portion of the outgoing LIDAR signal received by the second reference signal waveguide 148 serves as a second reference light signal.

The first reference signal waveguide 146 carries the first reference light signal to a first reference demultiplexer 150. When the first reference light signal includes multiple channels, the first reference demultiplexer 150 divides the first reference light signal into different first reference signals that each has a different wavelength. The first reference demultiplexer 150 outputs the first reference signals on different first reference waveguides 152. The first reference waveguides 152 each carry one of the first reference signals to one of several first processing components 154.

The second reference signal waveguide 148 carries the second reference light signal to a second reference demultiplexer 156. When the second reference light signal includes multiple channels, the second reference demultiplexer 156 divides the second reference light signal into different second reference signals that each has a different wavelength. The second reference demultiplexer 156 outputs the second reference signals on different second reference waveguides 158. The second reference waveguides 158 each carry one of the second reference signals to one of several second processing components 160.

The utility waveguide 16 carries the outgoing LIDAR signal to the signal-directing component 118. The signal-directing component 118 directs the outgoing LIDAR signal to the LIDAR signal waveguide 124. The LIDAR signal waveguide 124 receives the incoming LIDAR signal from the amplifier 20 and carries the incoming LIDAR signal to the signal-directing component 118. The signal-directing component 118 directs the incoming LIDAR signal to an intermediate waveguide 162. Suitable signal-directing components 118 include, but are not limited to, circulators, 2×2 optical couplers, 1×2 optical couplers, and switches.

The intermediate waveguide 162 carries the received portion of the incoming LIDAR signal to a beamsplitter 164. The beamsplitter 164 splits the beam into a precursor comparative incoming signal and a second comparative incoming signal. The precursor comparative incoming signal is received on a precursor comparative signal waveguide 165 and the second comparative incoming signal is received on a second comparative signal waveguide 166. The precursor comparative signal waveguide 165 carries the precursor comparative incoming signal to a polarization rotator 167. The polarization rotator outputs a first comparative incoming signal that is received on a first comparative signal waveguide 169. The first comparative signal waveguide 169 carries the first comparative incoming signal to a first comparative demultiplexer 168 and the second comparative signal waveguide 166 carries the second comparative incoming signal to a second comparative demultiplexer 170.

When the first comparative incoming LIDAR signal includes multiple channels, the first comparative demultiplexer 168 divides the first comparative incoming LIDAR signal into different first comparative signals that each has a different wavelength. The first comparative demultiplexer 168 outputs the first comparative signals on different first comparative waveguides 172. The first comparative waveguides 172 each carry one of the first comparative signals to a different first processing component 154.

When the second comparative light signal includes multiple channels, the second comparative demultiplexer 170 divides the first comparative incoming LIDAR signal into different second comparative signals that each has a different wavelength. The second comparative demultiplexer 170 outputs the second comparative signals on different second comparative waveguides 174. The second comparative waveguides 174 each carry one of the second comparative signals to a different second processing component 160.

The first comparative waveguides 172 and the first reference waveguides 152 are configured such that a comparative signal and the corresponding reference signal are received at the same first processing component 154. For instance, the first comparative waveguides 172 and the first reference waveguides 152 are configured such that the first comparative signal and the first reference signal of the same wavelength are received at the same first processing component 154.

The second comparative waveguides 174 and the second reference waveguides 158 are configured such that a comparative signal and the corresponding reference signal are received at the same second processing component 160. For instance, the second comparative waveguides 174 and the second reference waveguides 158 are configured such that the second comparative signal and the second reference signal of the same wavelength are received at the same second processing component 160.

The first processing components 154 each combines a first comparative signal with the corresponding first reference signal to form a first composite signal that carries LIDAR data for a sample region on the field of view. The second processing components 160 each combines a second comparative signal with the corresponding second reference signal to form a second composite signal that carries LIDAR data for a sample region on the field of view.

The LIDAR system is constructed such that the first comparative signals have the same polarization angle as the corresponding second comparative signals. For instance, the beamsplitter 164 can be a polarizing beam splitter. One example of a polarizing beamsplitter is constructed such that the channels in the precursor comparative incoming signal have a first polarization but do not have or do not substantially have a second polarization and the channels in the second comparative incoming signal have a second polarization but do not have or do not substantially have the first polarization. For instance, the polarizing beamsplitter can route a portion of the incoming LIDAR signal having the first polarization to the precursor comparative signal waveguide 165 and a portion of the incoming LIDAR signal having the second polarization to the second comparative signal waveguide 166. The first polarization and the second polarization can be linear polarities and the second polarization is different from the first polarization. For instance, the first polarization can be TE and the second polarization can be TM or the first polarization can be TM and the second polarization can be TE. Suitable beamsplitters include, but are not limited to, Wollaston prisms, MEMs-based polarizing beamsplitters and integrated optical polarizing beamsplitters using asymmetric y-branches, Mach-Zehnder interferometers and multi-mode interference couplers.

The polarization rotator can be configured to change the polarization of the channels in the precursor comparative incoming signal from the first polarization to the second polarization. As a result, the channels in the first comparative incoming signal have the second polarization but do not have or do not substantially have the first polarization. Accordingly, the channels in the first comparative incoming signal and the corresponding channels in the second comparative incoming signal each have the same polarization (the second polarization in this discussion). The first comparative signals that result from the first comparative incoming signal have the same polarization angle as the corresponding second comparative signals that result from the second comparative incoming signal. Suitable polarization rotators include, but are not limited to, rotation of polarization-maintaining fibers, Faraday rotators, half-wave plates, MEMs-based polarization rotators and integrated optical polarization rotators using asymmetric y-branches, Mach-Zehnder interferometers and multi-mode interference couplers.

Since the LIDAR output signal(s) are linearly polarized, the first reference signals can have the same linear polarization angle as the corresponding second reference signals. For instance, the first reference signals and the second reference signals can each have the same polarization as the first comparative incoming signal and the second comparative incoming signal. Accordingly, the first comparative signals, the second comparative signals, the first reference signals, and the second reference signals can each have the same polarization. In this example, the first comparative signals, the second comparative signals, the first reference signals, and the second reference signals can each have light of the second polarization.

As a result of the above configuration, the first composite signals each results from combining a reference signal and a comparative signal of the same polarization and will accordingly provide the desired beating between the reference signal and the comparative signal. For instance, the first composite signals each results from combining a reference signal and a comparative signal of the first polarization and excludes or substantially excludes light of the second polarization or the first composite signals each results from combining a reference signal and a comparative signal of the second polarization and excludes or substantially excludes light of the first polarization. Similarly, the second composite signals each includes a reference signal and a comparative signal of the same polarization will accordingly provide the desired beating between the reference signal and the comparative signal. For instance, the second composite signals each results from combining a reference signal and a comparative signal of the first polarization and excludes or substantially excludes light of the second polarization or the first composite signals each results from combining a reference signal and a comparative signal of the second polarization and excludes or substantially excludes light of the first polarization.

The above configuration results in the LIDAR data for a single sample region in the field of view being present in multiple different composite signals (i.e. the first composite signals and the second composite signal) generated for the sample region. In some instances, determining the LIDAR data for the sample region includes the electronics combining the LIDAR data from different composite signals (i.e. the first composite signals and the second composite signal). Combining the LIDAR data can include taking an average, median, or mode of the LIDAR data generated from multiple different composite signals. For instance, the electronics can average the distance between the source of a LIDAR output signal and the reflecting object determined from the first composite signal with the distance determined from the second composite signal and/or the electronics can average the radial velocity between the source of a LIDAR output signal and the reflecting object determined from the first composite signal with the radial velocity determined from the second composite signal.

In some instances, determining the LIDAR data for a sample region includes the electronics identifying one or more composite signals (i.e. the first composite signal and/or the second composite signal) as the source of the LIDAR data that is most represents reality (the representative LIDAR data). The electronics can then use the LIDAR data from the identified composite signal as the representative LIDAR data to be used for additional processing. For instance, the electronics can identify the signal (first composite signal or the second composite signal) with the larger amplitude as having the representative LIDAR data and can use the LIDAR data from identified signal for further processing by the LIDAR system. In some instances, the electronics combine identifying the composite signal with the representative LIDAR data with combining LIDAR data from different LIDAR signals. For instance, the electronics can identify each of the composite signals with an amplitude above an amplitude threshold as having representative LIDAR data and when more than two composite signals are identified as having representative LIDAR data, the electronics can combine the LIDAR data from each of identified composite signals. When one composite signal is identified as having representative LIDAR data, the electronics can use the LIDAR data from that composite signal as the representative LIDAR data. When none of the composite signals is identified as having representative LIDAR data, the electronics can discard the LIDAR data for the sample region associated with those composite signals.

Although FIG. 4 is described in the context of components being arranged such that the first comparative signals, the second comparative signals, the first reference signals, and the second reference signals each have the second polarization, other configurations of the components in FIG. 4 can arranged such that the first composite signals result from combining a reference signal and a comparative signal of the same linear polarization and the first composite signals result from combining a reference signal and a comparative signal of the same linear polarization. For instance, the polarization rotator can be positioned along the first reference signal waveguide 146 rather than between the precursor comparative signal waveguide 165 and the first comparative signal waveguide 169. As another example, when the first reference signals and the second reference signals each has the first polarization, the polarization rotator can be positioned along the second comparative signal waveguide 166.

The above system configurations result in the first portion of the LIDAR input signal (portion with the first polarization) and the first portion of the LIDAR input signal (portion with the second polarization) being directed into different composite signals. For instance, the system configuration can result in the first composite signals including more of the power from the first portion of the LIDAR input signal than the first composite signals and the second composite signals including more of the power from the second portion of the LIDAR input signal than the first composite signals. Alternately, the system configuration results in the first composite signals including more of the power from the second portion of the LIDAR input signal than the first composite signals and the second composite signals including more of the power from the first portion of the LIDAR input signal than the first composite signals. In some instances, the first portion of the LIDAR input signal has zero power or substantially zero power or the second portion of the LIDAR input signal has zero power or substantially zero power.

Although the LIDAR chips of FIG. 3A through FIG. 4 are disclosed in the context of generating multiple LIDAR output signals, the LIDAR chips of FIG. 3A through FIG. 4 can be configured and/or operated so as to generate or output one LIDAR output signal. For instance, the light sources 110 can output a single channel.

The LIDAR chip can include more than one component assembly that are each configured to generate one or more LIDAR output signals and to use each of the LIDAR output signals to generate light signals and/or electrical signals that include LIDAR data (distance and/or radial velocity between the LIDAR system and a reflecting object). For instance, FIG. 5 illustrates a LIDAR chip that includes multiple components assemblies that are each constructed according to FIG. 3A.

The outgoing LIDAR signal from each of the different component assemblies can each be received at a different amplifier. In contrast, FIG. 5 illustrates the outgoing LIDAR signal from each of the different component assemblies received at an amplifier chip 174 that includes multiple amplifiers 20. Each of the amplifiers 20 on the amplifier chip 174 receives a different one of the outgoing LIDAR signals.

Figure 5:
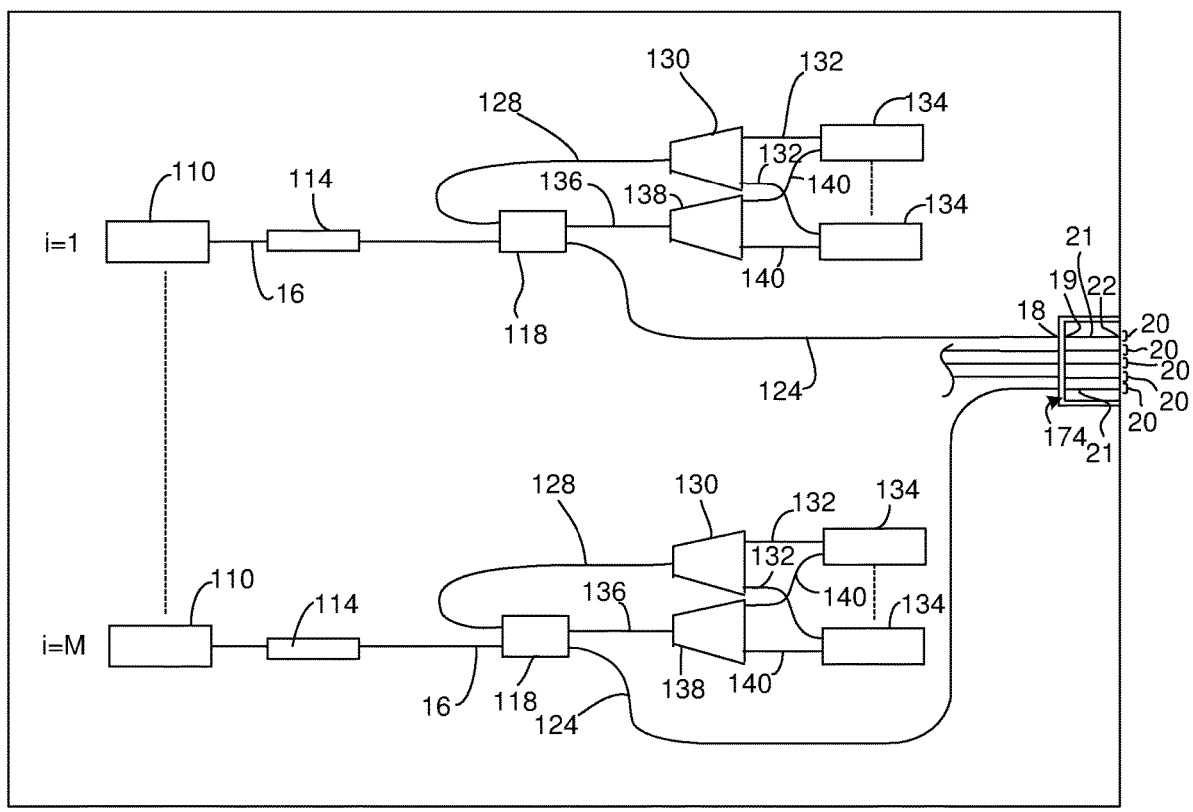
FIG. 5 is a schematic of an embodiment of a LIDAR system that includes multiple component assemblies.

Although FIG. 5 illustrates multiple component assemblies included on the same LIDAR chip, the multiple component assemblies can be included on different LIDAR chips and the different LIDAR chips can be positioned on a common substrate (not shown). For instance, multiple LIDAR chips constructed according to FIG. 3A can be positioned on a common substrate.

The LIDAR chips of FIG. 1A through FIG. 5 include one or more amplifier waveguides that are each optically aligned with one LIDAR chip waveguide but are not optically aligned with any other LIDAR chip waveguide. LIDAR chip waveguides can be integrated with the LIDAR chip. In some instances, the LIDAR chip waveguides are entirely or partially positioned over the base 81 in that a line that is perpendicular to the base 81 can pass through the LIDAR chip waveguide for the entirety of the portion of the LIDAR chip waveguide positioned over the base 81. As a result, in some instances, the LIDAR chip waveguides are immobilized relative to the base 81 for all or a portion of the length of the LIDAR chip waveguides. In some instances, the LIDAR chip waveguides are ridge waveguides such as the ridge waveguides constructed according to FIG. 2. FIG. 1A through FIG. 5 illustrate the amplifier chips positioned at the edge of the LIDAR chip such that the one or more amplifier waveguides that are each optically aligned with only one LIDAR chip waveguide. For instance, the amplifier chips can be positioned at an edge of the LIDAR chip such that a line can be drawn starting at a facet on the amplifier chip and extending away from the amplifier chip in the direction of propagation of the outgoing LIDAR signal at the facet and without pass through any portion of the LIDAR chip.

Figure 6A:
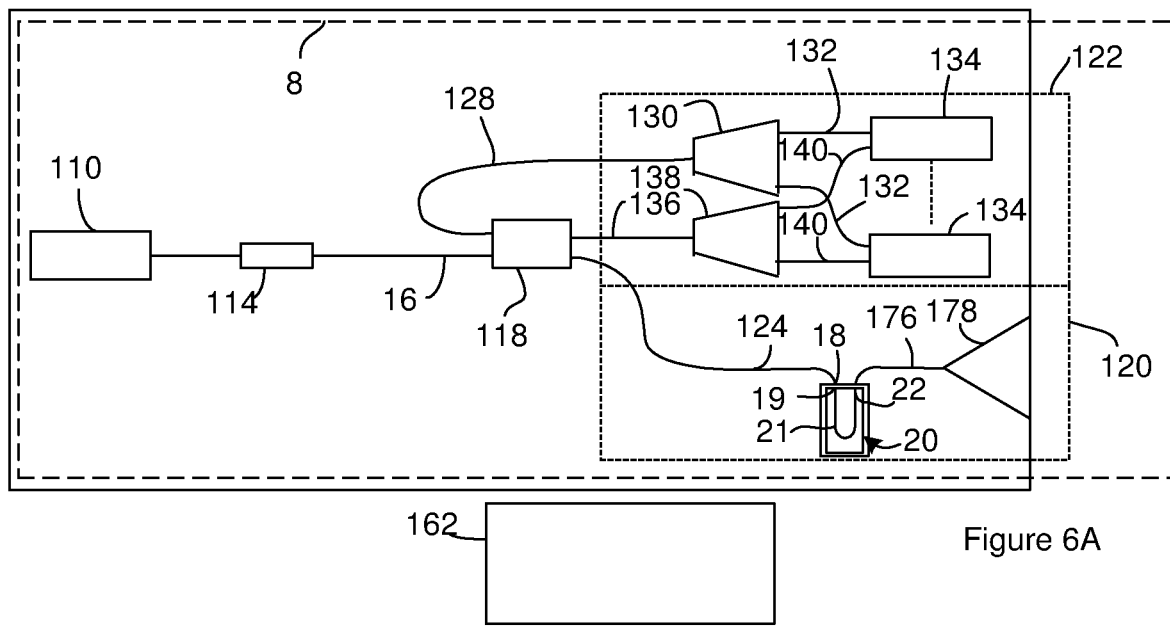
FIG. 6A is a schematic of an embodiment of a LIDAR system that includes an amplifier aligned with multiple waveguides.

Embodiments of the amplifier chip can be positioned on the LIDAR chip such that the first facet is optically aligned with a facet of a first waveguide and the second facet is optically aligned with a facet of a second waveguide. In this arrangement, the amplifier waveguide receives a light signal from the first waveguide and guides the light signal such that the second waveguide receives the light signal from the amplifier waveguide. Additionally, the amplifier chip can be constructed such that an angle between a direction that the light signal travels when entering the amplifier waveguide and a direction that the light signal travels when exiting the amplifier waveguide is less than 180° or is less than or equal to 90°. As an example, FIG. 6A illustrates an embodiment of the LIDAR chip where the amplifier waveguide 21 receives the outgoing light signal from the LIDAR signal waveguide 124 (a first waveguide) and guides the light signal such that a second portion of the LIDAR signal waveguide 176 (a second waveguide) receives the outgoing light signal from the amplifier waveguide 21. Additionally, the direction that the light signal travels when entering the amplifier waveguide 21 is parallel or essentially parallel to a direction that the light signal travels when exiting the amplifier waveguide 21. As a result, the angle between the direction that the outgoing LIDAR signal travels when entering the amplifier waveguide and the direction that the outgoing LIDAR signal travels when exiting the amplifier waveguide is 0° or essentially 0° and is accordingly, less than 180°.

In FIG. 6A, the second portion of the LIDAR signal waveguide 176 carries the outgoing LIDAR signal to an output component 178. When the outgoing light signal includes multiple different channels at different wavelengths, the output component 178 can separate the outgoing light signal into multiple LIDAR output signals that are each at a different wavelength (channel) and are directed to different sample regions in a field of view. In some instances, the LIDAR output signals travel away from the LIDAR system and serves as a system output signals. In other instances, system output signals travel away from the LIDAR system and includes or consists of light from the LIDAR output signals. While traveling away from the LIDAR system, the system output signals can be reflected by one or more objects located outside of the LIDAR system. The reflected light includes LIDAR data. All or a portion of the reflected light returns to the output component 178 as LIDAR input signals. The output component 178 combines the LIDAR input signals and outputs the result on the second portion of the LIDAR signal waveguide 176 as the incoming light signal.

Figure 6B:
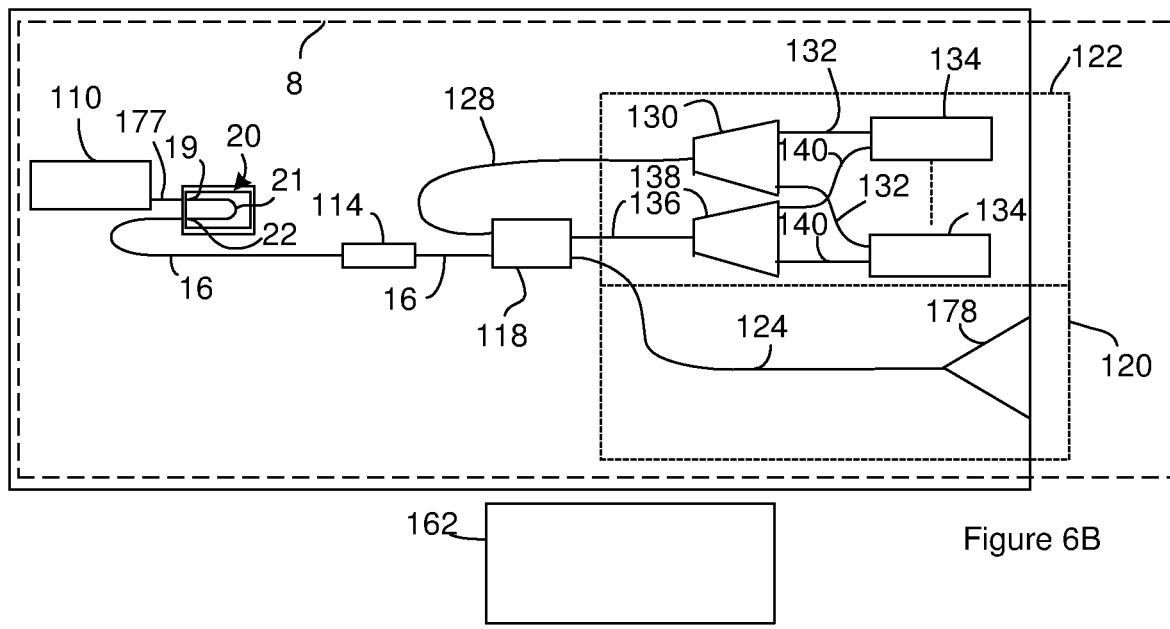
FIG. 6B is a schematic of another embodiment of a LIDAR system that includes an amplifier aligned with multiple waveguides.

The amplifier chip disclosed in the context of FIG. 6A can be positioned along other LIDAR chip waveguides. For instance, FIG. 6B illustrates the amplifier chip of FIG. 6A positioned along the utility waveguide. A first portion of the utility waveguide 177 receives the outgoing LIDAR signal from the light source 110 and carries the outgoing LIDAR signal to the amplifier chip 20. The amplifier waveguide 21 receives the outgoing light signal from the first portion of the utility waveguide 177 (a first waveguide) and guides the light signal such that the utility waveguide 16 (a second waveguide) receives the outgoing light signal from the amplifier waveguide 21. In the configuration of FIG. 6B, the outgoing LIDAR signal is amplified without amplifying the comparative signal. In contrast, the configuration of FIG. 6A provides amplification of both the outgoing LIDAR signal and the resulting comparative signal.

In some instances, the output component 178 also includes beam steering functionality. In these instances, the output component 178 can be in electrical communication with the electronics 62. The electronics 62 can operate the output component 178 so as to steer the one or more LIDAR output signals to different sample region(s) in the field of view. The output component 178 and/or electronics 62 can be configured such that the different LIDAR output signals are steered independently or are steered concurrently.

A single amplifier chip can include one or more amplifiers waveguides according to FIG. 1 through FIG. 5 and one or more amplifiers waveguides constructed according to FIG. 6A and FIG. 6B.

Figure 7:
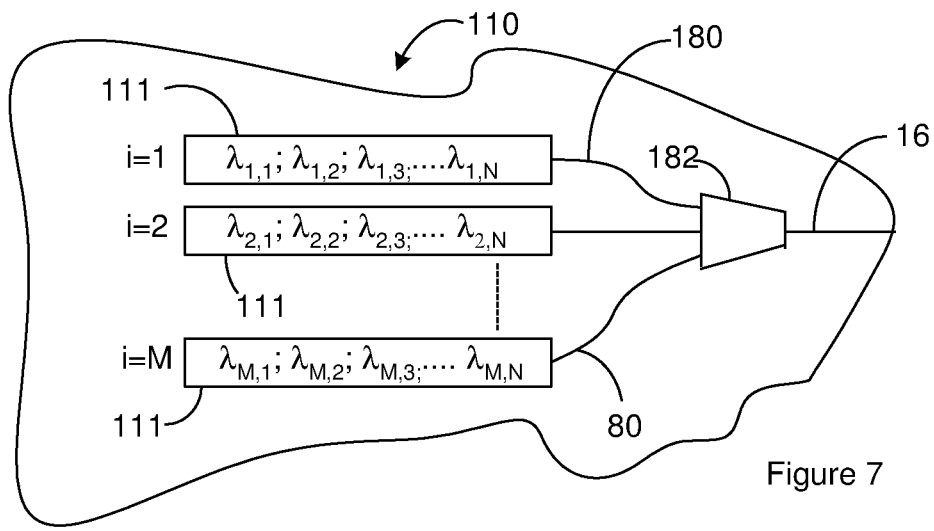
FIG. 7 illustrates multiple light sources configured to generate an outgoing LIDAR signal that includes multiple channels.

Although the above LIDAR systems are illustrated as having a single light source 110 in each component assembly, the light source 110 can include multiple light sources. For instance, FIG. 7 illustrates a light source 110 that includes M light sub-sources 111 that each generates N channels. The channels are each received on a channel waveguide 180. The channel waveguides carry the channels to a channel multiplexer 182 that combines the channels so as to form the outgoing LIDAR signal that is received on the utility waveguide 16.

In FIG. 7, each of the channels is labeled $\lambda_{i,j}$ where i is the number of the light sub-source 111 and is from 1 to M and j is the number of the channel for light sub-source j and is from 1 to N. As noted above, the light sub-sources 111 can be configured such that the wavelengths of the channels are periodically spaced in that the wavelength increase from one channel to the next channel ($\Delta\lambda$) is constant or substantially constant. In some instances, the light sub-sources 111 are configured such that channels with adjacent wavelengths are generated by different light sub-sources 111. For instance, the light sub-sources 111 can be configured such that $\lambda_{i,j}=\lambda_o+((i-1)+(j-1)(M))(\Delta\lambda)$. Suitable light sub-sources 111 for this configuration include, but are not limited to, comb lasers. In this configuration, the channel multiplexer can be a cyclic multiplexer designed with the wavelength spacing $((N-1)*\Delta\lambda)$ equal to a multiple of the Free Spectral Range (FSR) of the channel multiplexer. Accordingly, the channel multiplexer can be designed to cycle over the wavelength range $((N-1)*\Delta\lambda)$. A suitable cyclic multiplexer includes, but is not limited to, the 'colorless' AWG from Gemfire (8-Channel Cyclic Arrayed Waveguide Grating, 2018).

Suitable values for the number of light sub-sources 111 (M) include, but are not limited to, values greater than or equal to 2, 4, or 8, and/or less than 16, 32, or 64. Suitable values for the number of channels provided by a light sub-sources 111 (N) include, but are not limited to, values greater than or equal to 2, 4, or 8, and/or less than 16, 32, or 64. Suitable values for the wavelength increase from one channel to the next channel ($\Delta\lambda$) include, but are not limited to, values greater than or equal to 0.2 nm, 0.4 nm, or 0.6 nm, and/or less than 0.8 nm, 1.0 nm, or 1.5 nm. Suitable values for the wavelength of the channel with the shortest wavelength include, but are not limited to, values greater than or equal to 1.3 µm, 1.4 µm, or 1.5 µm, and/or less than 1.6 µm, 1.7 µm, or 1.8 µm. In one example, the LIDAR system includes M greater than or equal to 2, 4, or 8, and/or less than 16, 32, or 64; N greater than or equal to 2, 4, or 8, and/or less than 16, 32, or 64; and $\Delta\lambda$ greater than or equal to 0.2 nm, 0.4 nm, or 0.6 nm, and/or less than 0.8 nm, 1 nm, or 1.5 nm.

In some instances, the light sources 110 are configured such that at least a portion of the light sub-sources 111 each generates two or more channels with adjacent wavelengths. For instance, the light sub-sources 111 can be configured such that $\lambda_{i,j}=\lambda_o+((j-1)+(i-1)(N))(\Delta\lambda)$. Suitable light sub-sources 111 for this configuration include, but are not limited to, comb lasers. In this configuration, the channel multiplexer can be a broadband multiplexer with a bandwidth of at least N$\Delta\lambda$. Suitable broadband multiplexers include, but are not limited to, arrayed waveguide gratings (AWG) and thin film filters.

Figure 8:
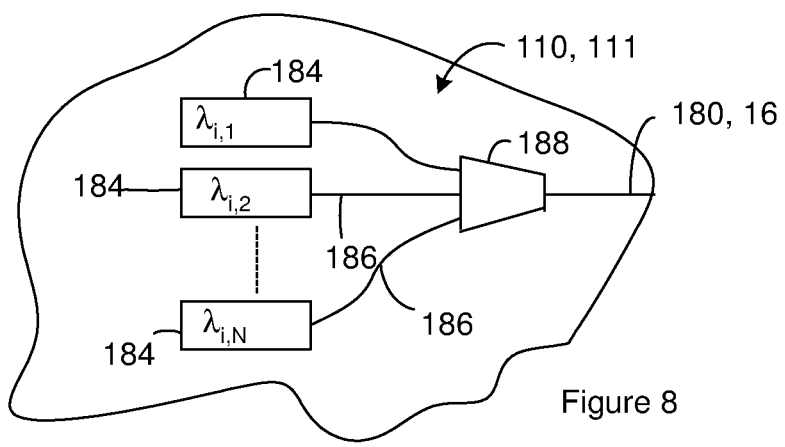
FIG. 8 illustrates a light source that includes multiple laser sources.

As noted above, one or more of the light sources and/or light sub-sources can be a comb laser. However, other constructions of the light source 110 are possible. For instance, FIG. 8 illustrates an example of a light source 110 or light sub-source 111 that includes multiple laser sources 184. The light source 110 or light sub-source 111 illustrated in FIG. 8 includes multiple laser sources 184 that each outputs one of the channels on a source waveguide 186. The source waveguides 186 carry the channels to a laser multiplexer 188 that combines the channels so as to form a light signal that is received on a channel waveguide or the utility waveguide 16. The electronics can operate the laser sources 184 so the laser sources 184 concurrently output each of the channels. Suitable lasers for use with a light source 110 or light sub-source 111 constructed according to FIG. 8 include, but are not limited to, external cavity lasers, distributed feedback lasers (DFBs), and Fabry-Perot (FP) lasers. External cavities lasers are advantageous in this embodiment because of their generally narrower linewidths, which can reduce noise in the detected signal.

Figure 9:
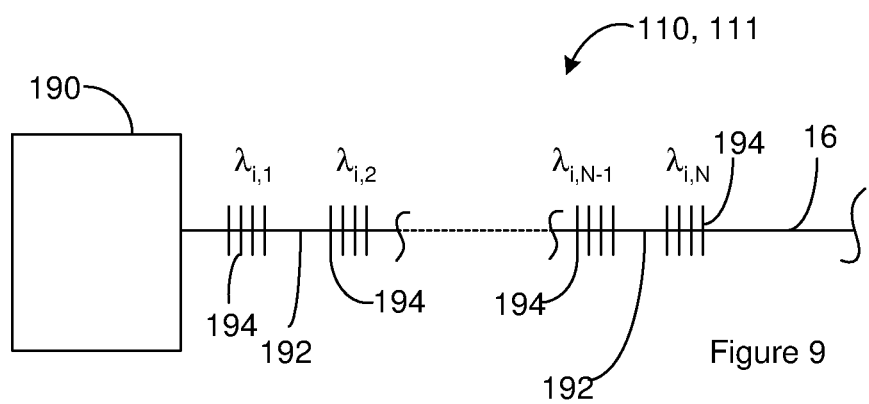
FIG. 9 illustrates one example of a structure configured to generate a light signal that includes multiple channels.

FIG. 9 illustrates another example of a possible light source 110 or light sub-source 111 construction. The light source 110 or light sub-source 111 includes a gain element 190 such as the gain element of a semiconductor laser. A gain waveguide 192 is optically aligned with the gain element so as to receive a light signal from the gain element. In some instances, the gain waveguide excludes the gain medium included in the gain element. For instance, the gain waveguide can be a ridge waveguide on a silicon-on-insulator chip. Multiple partial return devices 194 are positioned along the gain waveguide such that the partial return devices interact with the light signal.

During operation, electronics operate the gain element such that the gain medium outputs the light signal. The partial return devices 194 each passes a portion of the light signal. The portion of the light signal that the utility waveguide 16 receives from the partial return devices serves as the outgoing LIDAR signal. The partial return devices also return a portion of the light signal to the gain element such that the returned portion of the light signal travels through the gain element. The gain element can include a fully or partially reflective layer that receives returned portion of the light signal from the gain element and reflects the returned portion of the light signal back to the gain element allowing the returned portion of the light signal to amplify and lase. Accordingly, the light source 110 or light sub-source 111 can be an external cavity laser.

The partial return devices can be configured such that each partial return device returns a different wavelength of light. For instance, the partial return devices can be configured such that the wavelength of each one of the channels that is to be output by the light source 110 is returned by at least one of the partial return devices. As a result, each of the desired channels will lase and be present in the outgoing LIDAR signal. Suitable partial return devices include, but are not limited to, Bragg gratings.

All or a portion of the processing components 134 can be constructed and/or operated as disclosed in the context of FIG. 1A. However, the processing components 134 can have other constructions and/or operating principles. As an example, FIG. 10A through FIG. 10B illustrate an example of a suitable processing components 134 for use in the LIDAR chips and/or LIDAR systems. A first splitter 202 divides a reference signal carried on a reference waveguide 27, 140, 152, or 158 onto a first reference waveguide 210 and a second reference waveguide 208. The first reference waveguide 210 carries a first portion of the reference signal to a light-combining component 211. The second reference waveguide 208 carries a second portion of the reference signal to a second light-combining component 212.

A second splitter 200 divides the comparative signal carried on the comparative waveguide 30, 130, 172, or 174 onto a first comparative waveguide 204 and a second comparative waveguide 206. The first comparative waveguide 204 carries a first portion of the comparative signal to the light-combining component 211. The second comparative waveguide 208 carries a second portion of the comparative signal to the second light-combining component 212.

The second light-combining component 212 combines the second portion of the comparative signal and the second portion of the reference signal into a second composite signal. Due to the difference in frequencies between the second portion of the comparative signal and the second portion of the reference signal, the second composite signal is beating between the second portion of the comparative signal and the second portion of the reference signal. The light-combining component 212 also splits the resulting second composite signal onto a first auxiliary detector waveguide 214 and a second auxiliary detector waveguide 216.

The first auxiliary detector waveguide 214 carries a first portion of the second composite signal to a first auxiliary light sensor 218 that converts the first portion of the second composite signal to a first auxiliary electrical signal. The second auxiliary detector waveguide 216 carries a second portion of the second composite signal to a second auxiliary light sensor 220 that converts the second portion of the second composite signal to a second auxiliary electrical signal. Examples of suitable light sensors include germanium photodiodes (PDs), and avalanche photodiodes (APDs).

The first light-combining component 211 combines the first portion of the comparative signal and the first portion of the reference signal into a first composite signal. Due to the difference in frequencies between the first portion of the comparative signal and the first portion of the reference signal, the first composite signal is beating between the first portion of the comparative signal and the first portion of the reference signal. The light-combining component 211 also splits the first composite signal onto a first detector waveguide 221 and a second detector waveguide 222.

The first detector waveguide 221 carries a first portion of the first composite signal to a first light sensor 223 that converts the first portion of the second composite signal to a first electrical signal. The second detector waveguide 222 carries a second portion of the second composite signal to a second auxiliary light sensor 224 that converts the second portion of the second composite signal to a second electrical signal. Examples of suitable light sensors include germanium photodiodes (PDs), and avalanche photodiodes (APDs).

The first reference waveguide 210 and the second reference waveguide 208 are constructed to provide a phase shift between the first portion of the reference signal and the second portion of the reference signal. For instance, the first reference waveguide 210 and the second reference waveguide 208 can be constructed so as to provide a 90 degree phase shift between the first portion of the reference signal and the second portion of the reference signal. As an example, one reference signal portion can be an in-phase component and the other a quadrature component. Accordingly, one of the reference signal portions can be a sinusoidal function and the other reference signal portion can be a cosine function. In one example, the first reference waveguide 210 and the second reference waveguide 208 are constructed such that the first reference signal portion is a cosine function and the second reference signal portion is a sine function. Accordingly, the portion of the reference signal in the second composite signal is phase shifted relative to the portion of the reference signal in the first composite signal, however, the portion of the comparative signal in the first composite signal is not phase shifted relative to the portion of the comparative signal in the second composite signal.

The first light sensor 223 and the second light sensor 224 can be connected as a balanced detector and the first auxiliary light sensor 218 and the second auxiliary light sensor 220 can also be connected as a balanced detector. For instance, FIG. 10B provides a schematic of the relationship between the electronics, the first light sensor 223, the second light sensor 224, the first auxiliary light sensor 218, and the second auxiliary light sensor 220. The symbol for a photodiode is used to represent the first light sensor 223, the second light sensor 224, the first auxiliary light sensor 218, and the second auxiliary light sensor 220 but one or more of these sensors can have other constructions. In some instances, all of the components illustrated in the schematic of FIG. 10B are included on the LIDAR system. In some instances, the components illustrated in the schematic of FIG. 10B are distributed between the LIDAR system and electronics located off of the LIDAR system.

The electronics connect the first light sensor 223 and the second light sensor 224 as a first balanced detector 225 and the first auxiliary light sensor 218 and the second auxiliary light sensor 220 as a second balanced detector 226. In particular, the first light sensor 223 and the second light sensor 224 are connected in series. Additionally, the first auxiliary light sensor 218 and the second auxiliary light sensor 220 are connected in series. The serial connection in the first balanced detector is in communication with a first data line 228 that carries the output from the first balanced detector as a first data signal. The serial connection in the second balanced detector is in communication with a second data line 232 that carries the output from the first balanced detector as a second data signal. The first data signal and the second data signal are beating as a result of the beating between the comparative signal and the reference signal, i.e. the beating in the first composite signal and in the second composite signal.

The first data line 228 carries the first data signal to a first switch 234. The first switch can be in a first configuration where the first data signal is carried to a distance branch 136 or in a second configuration where the first data signal is carried to a velocity branch 238. In FIG. 10B, the first switch 234 is shown in the first configuration. The second data line 232 carries the second data signal to a second switch 240. The second switch can be in a first configuration where the second data signal is carried to the distance branch 236 or in a second configuration where the second data signal is carried to a velocity branch 238. In FIG. 10B, the second switch 240 is shown in the first configuration. A suitable switch for use as the first switch and/or second switch includes, but is not limited to, an electromechanical switch, and a solid state MOSFET or PIN diode switch.

The electronics operate the first switch and the second switch such that they are in the same configuration during the first period and during the second period. For instance, the electronics can operate the first switch and the second switch such that the first switch and the second switch are both in the first configuration during the first period and both in the second configuration during the second period. In this example, the first data signal and the second data signal are carried to the distance branch 236 during the first period and to the velocity branch 238 during the second period.

During operation of the LIDAR system, the generation of LIDAR data is divided into a series of cycles where LIDAR data is generated for each cycle. In some instances, each of the cycles corresponds to a different sample region in the field of view. Accordingly, different cycles can generate LIDAR data for different sample regions in a field of view.

The cycles can be performed such that the time for each cycle can be divided into different time periods that include a distance time period (first period) and a velocity time period (second period). The distance between the reflecting object and the LIDAR chip can be determined in the distance period and the radial velocity between the reflecting object and the LIDAR chip can be determined in the velocity period.

The electronics are configured to use the first data signal and the second data signal to determine or approximate at least the distance between the LIDAR system and the reflecting object. For instance, during the first period, the electronics can operate the modulator 114 so as to add chirp to the amplitude of the outgoing LIDAR signal and accordingly the LIDAR output signal. Adding chirp to the amplitude can include modulating the amplitude of the outgoing LIDAR signal such that the amplitude of the outgoing LIDAR signal is a function of a sinusoid. In one example, the amplitude of the outgoing LIDAR signal is modulated such that the amplitude of the outgoing LIDAR signal is a square root of a function that includes a sinusoid and/or is a square root of a sinusoid. For instance, the outgoing LIDAR signal can be modulated so as to produce a modulated outgoing LIDAR signal and LIDAR output signal mathematically represented by Equation 1: $(M+N*cos(C*t+D*t^2))^{1/2} cos*(F*t)$ where M, N, C, D and F are constants, t represents time, $M>0$, $N>0$, and $M \geq N$ in order to prevent the radicand from becoming negative, $C>0$, $D \neq 0$. As will become evident below, F can be a function of the frequency of the LIDAR output signal ($f_c$). In Equation 1, F and C can be selected such that $F \gg C$.

The distance branch includes a first distance branch line 242. During the first period, the first distance branch line 242 carries the first data signal to a first multiplier 244. In FIG. 10B, the first multiplier 244 is configured to square the amplitude of the first data signal and to output a first multiplied data signal. The distance branch includes a second distance branch line 246. During the first period, the second distance branch line 246 carries the second data signal to a second multiplier 248. In FIG. 10B, the second multiplier 248 is configured to square the amplitude of the second data signal and to output a second multiplied data signal. Suitable first multipliers and/or second multipliers include, but are not limited to, RF mixers such as a Gilbert cell mixer.

The distance branch includes an adder 250 that sums the first multiplied data signal and the second multiplied data signal. The adder outputs a summed data signal. Suitable adders include, but are not limited to, RF combiners including resistive or hybrid combiners. The distance branch includes a low-pass filter 252 that receives the summed data signal and outputs a beating data signal. The low-pass filter is selected to remove higher frequency contributions to the summed data signal that are artifacts of the mixing of the reference and return signals. The low-pass filter can be selected to have a bandwidth greater than or equal to: $f_{dmax}/2 + \alpha \tau_{0max}$ where $f_{dmax}$ represents the maximum level of the Doppler shift of the LIDAR input signal relative to the LIDAR input signal for which the LIDAR system is to provide reliable results, $\tau_{0max}$ represents maximum delay between transmission of the LIDAR output signal and the receipt of the LIDAR input signal, and α represents the rate of change in the frequency of the chirp added to the amplitude of the modulated outgoing LIDAR signal during the duration of the sample period (i.e. the first period). In some instances, α is determined from B/T where B represents the change in the frequency of the chirp added to the amplitude of the modulated outgoing LIDAR signal during the duration of the sample period and T is the duration of the sample period. In some instances, T is determined from:

$$T = \frac{\lambda_c}{2\Delta v_{min}} + \tau_{0max}$$

where $\lambda_c$ represents the wavelength of the outgoing LIDAR signal, $\Delta v_{min}$: represents velocity resolution and B can be determined from $$B = \frac{cT}{2(T - \tau_{0max})\Delta R_{min}}$$

where c represents the speed of light and $\Delta R_{min}$ represents distance resolution. In some instances, the filter has a bandwidth greater than 0.1 GHz, 0.2 GHz, or 0.3 GHz and/or less than 0.4 GHz, 0.5 GHz, or 1 GHz. Corresponding values for the sweep period (T) can be 10 μs, 8 μs, 4 μs, 3 μs, 2 μs, and 1 μs.

The distance branch includes an Analog-to-Digital Converter (ADC) 254 that receives the beating data signal from the filter. The Analog-to-Digital Converter (ADC) 254 converts the beating data signal from an analog form to digital form and outputs the result as a digital LIDAR data signal. As discussed above, the conversion of the beating data signal includes sampling the beating data signal at a sampling rate. The addition of the chirp to the amplitude of the LIDAR output signal substantially reduces or removes the effects of radial velocity from the beating of the composite signal and the resulting electrical signals. For instance, the frequency shift of the LIDAR output signal relative to the LIDAR input signal ("frequency shift," Δf) can be written as $\Delta f = \Delta f_d + \Delta f_s$ where $\Delta f_d$ represents the change in frequency due to the Doppler shift and $\Delta f_s$ is the change in frequency due to the separation between the reflecting object and the LIDAR system. The outgoing LIDAR signal can be modulated so as to produce a modulated outgoing LIDAR signal and accordingly, a LIDAR output signal that is also modulated, where the change in frequency due to the Doppler shift ($\Delta f_d$) is less than 10%, 5%, 1%, or even 0.1% of the Doppler shift that would occur from a sinusoidal LIDAR output signal serving as the LIDAR and having a constant amplitude and the same frequency as the modulated outgoing LIDAR signal and/or the LIDAR output signal. For instance, the outgoing LIDAR signal and/or the LIDAR output signal can be modulated so as to produce a modulated outgoing LIDAR signal and/or a LIDAR output signal where the change in frequency due to the Doppler shift ($\Delta f_d$) is less than 10%, 5%, 1%, or even 0.1% of the Doppler shift that would occur from a continuous wave serving as the LIDAR output signal and having the same frequency as the modulated outgoing LIDAR signal and/or the LIDAR output signal. In another example, the outgoing LIDAR signal and/or the LIDAR output signal are modulated so as to produce a modulated outgoing LIDAR signal and/or a LIDAR output signal where the change in frequency due to the Doppler shift ($\Delta f_d$) is less than 10%, 5%, 1%, or even 0.1% of the Doppler shift that would occur from the outgoing LIDAR signal before modulation (the unmodulated outgoing LIDAR signal) serving as the LIDAR output signal. These results can be achieved by increasing the value of the Equation 1 variable F relative to C. For instance, F can represent $2\pi f_c$ and C can represent $2\pi f_1$ where $f_1$ denotes the base frequency of the frequency-chirp in the amplitude of the modulated outgoing LIDAR signal. Accordingly, F can be increased relative to C by increasing the value of the frequency of the LIDAR output signal ($f_c$) relative to the chirp base frequency ($f_1$). As an example, $f_c$ and $f_1$ can be selected such that $f_c \gg f_1$. In some instances, $f_c$ and $f_1$ are selected such that a ratio of $f_c:f_1$ is greater than 2:1, 10:1, $1 \times 10^4:1$, $5 \times 10^4$, or $1 \times 10^5:1$ and/or less than $5 \times 10^5$, $1 \times 10^6$, $5 \times 10^6$ or $5 \times 10^8$. Accordingly, the variables F and C can also have these same values for a ratio of F:C. The reduction and/or removal of the change in frequency due to the Doppler shift ($\Delta f_d$) from the frequency shift lowers the beat frequency and accordingly reduces the required sampling rate.

The distance branch includes a transform module 256 that receives the digital LIDAR data signal from the Analog-to-Digital Converter (ADC) 254. The transform module 256 is configured to perform a real transform on the digital LIDAR data signal so as to convert from the time domain to the frequency domain. This conversion provides an unambiguous solution for the shift in frequency of the shift of the LIDAR input signal relative to the LIDAR input signal that is caused by the distance between the reflecting object and the LIDAR system. A suitable real transform is a Fourier transform such as a Fast Fourier Transform (FFT). The classification of the transform as a real transform distinguishes the transform from complex transforms such as complex Fourier transforms. The transform module can execute the attributed functions using firmware, hardware or software or a combination thereof.

Since the frequency provided by the transform module does not have input from, or does not have substantial input from, a frequency shift due to relative movement, the determined frequency shift can be used to approximate the distance between the reflecting object and the LIDAR system. For instance, the electronics can approximate the distance between the reflecting object and the LIDAR system ($R_0$) using Equation 3: $R_0 = c \ast \Delta f/(2\alpha)$ where $\Delta f$ can be approximated as the peak frequency output from the transform module, and c is the speed of light.

The velocity branch can be configured to use the first data signal and the second data signal to determine or approximate at least the radial velocity of the LIDAR system and the reflecting object. The LIDAR output signal with a frequency that is a function of time disclosed in the context of FIG. 1 through FIG. 5 can be replaced by a LIDAR output signal where the frequency of the LIDAR output signal is not a function of time. For instance, the LIDAR output signal can be a continuous wave (CW). For instance, during the second period, the modulated outgoing LIDAR signal, and accordingly the LIDAR output signal, can be an unchirped continuous wave (CW). As an example the modulated outgoing LIDAR signal, and accordingly the LIDAR output signal, can be represented by Equation 2: $G \ast \cos(H \ast t)$ where G and H are constants and t represents time. In some instances, G represents the square root of the power of the outgoing LIDAR signal and/or H represents the constant F from Equation 1. In instances where the output of the light source has the waveform that is desired for the modulated outgoing LIDAR signal, the electronics need not operate the modulator 114 so as to modify the outgoing LIDAR signal. In these instances, the output of the light source(s) can serve as the modulated outgoing LIDAR signal and accordingly the LIDAR output signal. In some instances, the electronics operate the modulator 114 so as to generate a modulated outgoing LIDAR signal with the desired form.

Since the frequency of the LIDAR output signal is constant in the second period, changing the distance between reflecting object and LIDAR system does not cause a change to the frequency of the LIDAR input signal. As a result, the separation distance does not contribute to the shift in the frequency of the LIDAR input signal relative to the frequency of the LIDAR output signal. Accordingly, the effect of the separation distance has been removed or substantially from the shift in the frequency of the LIDAR input signal relative to the frequency of the LIDAR output signal.

The velocity branch includes a first velocity branch line 260 and a second velocity branch line 260. During the second period, the first velocity branch line 260 carries the first data signal to an Analog-to-Digital Converter (ADC) 164 which converts the first data signal from an analog form to a digital form and outputs a first digital data signal. As discussed above, the conversion of the first data signal is done by sampling the first data signal at a sampling rate. The use of a continuous wave as the LIDAR output signal substantially removes the effects of distance between the reflecting object and LIDAR system from the beating of the composite signal and the resulting electrical signals. Accordingly, the beating frequency is reduced and the required sampling rate is reduced.

The second velocity branch line 262 carries the second data signal to an Analog-to-Digital Converter (ADC) 266 which converts the second data signal from an analog form to a digital form and outputs a second digital data signal. As discussed above, the conversion of the second data signal includes sampling the second data signal at a sampling rate. The use of a continuous wave as the LIDAR output signal substantially reduces or removes the effects of distance between the reflecting object and LIDAR system from the beating of the second composite signal and the resulting electrical signals. Accordingly, the beating frequency is reduced and the required sampling rate is reduced.

The sampling rate for the Analog-to-Digital Converter (ADC) 264 can be the same or different from the sampling rate for the Analog-to-Digital Converter (ADC) 266.

The velocity branch includes a transform module 268 that receives the first digital data signal from the Analog-to- Digital Converters (ADC) 264 and the second digital data signal from the Analog-to-Digital Converters (ADC) 266. Since the first data signal is an in-phase component and the second data signal its quadrature component, the first data signal and the second data signal together act as a complex velocity data signal where the first data signal is the real component and the second data signal is the imaginary component. As a result, the first digital data signal can be the real component of a digital velocity data signal and the second data signal can be the imaginary component of the digital velocity data signal. The transform module 168 can be configured to perform a complex transform on the digital velocity data signal so as to convert from the time domain to the frequency domain. This conversion provides an unambiguous solution for the shift in frequency of LIDAR input signal relative to the LIDAR input signal that is caused by the radial velocity between the reflecting object and the LIDAR system. A suitable complex transform is a Fourier transform such as a complex Fast Fourier Transform (FFT). The transform module can execute the attributed functions using firmware, hardware or software or a combination thereof.

Since the frequency shift provided by the transform module 268 does not have input from a frequency shift due to the separation distance between the reflecting object and the LIDAR system, and because of the complex nature of the velocity data signal, the output of the transform module 268 can be used to approximate the radial velocity between the reflecting object and the LIDAR system. For instance, the electronics can approximate the radial velocity between the reflecting object and the LIDAR system (v) using Equation 4: $v=c*f_d/(2*f_c)$ where $f_d$ is approximated as the peak frequency output from the transform module 268, c is the speed of light, and $f_c$ represents the frequency of the LIDAR output signal.

Additional components can be added to the schematic of FIG. 10B. For instance, when the LIDAR system generates multiple LIDAR output signals or is used with other LIDAR systems that generate LIDAR output signals (i.e., by means of frequency or wavelength division multiplexing, FDM/WMD), the LIDAR system can include one or more filters to remove interfering signals from the real and/or imaginary components of the beating data signal and/or of the velocity data signal. Accordingly, the LIDAR system can include one or more filters in addition to the illustrated components. Suitable filters include, but are not limited to, lowpass filters. In the case of the optical design, if the frequency of the interfering components fall outside the bandwidth of the balance detector(s), additional filtering may not be necessary as it may be effectively provided by the balance detector(s).

The sampling rate that is used during the first period and the second period can be selected to have a value that is greater than or equal to the larger of two values selected from the group consisting of the minimum sampling rate for the first period and the minimum sampling rate for the second period. For instance, during the first period the range of rates for the first period sampling rate ($f_{s1}$) can be determined by $f_{s1} \geq 2 \times \alpha \tau_{0max}$ where $\tau_{0max}$ represents the maximum amount of time between the transmission of the LIDAR output signal and the receipt of the LIDAR input signal. During the second period the range of rates for the second period sampling rate ($f_{s2}$) can be determined by $f_{s2} \geq 2 \times f_{dmax}$ where $f_{dmax}$ represents the maximum level of the Doppler shift of the LIDAR input signal relative to the LIDAR input signal for which the LIDAR system is to provide reliable results. The maximum is determined by the largest level for which the LIDAR system is to provide reliable results. Accordingly, the maximum distance generally corresponds to the distance for the field of view set in the LIDAR specifications and the maximum Doppler shift generally corresponds to the Doppler shift that would occur at the maximum radial velocity values set in the specifications. These two equations show that the minimum sampling rate for the first period is $2\alpha\tau_{0max}$ and the minimum sampling rate for the second period is $2f_{dmax}$. As a result, the sampling rate is selected to have a value that is greater than or equal to the larger of $2\alpha\tau_{0max}$ and $2f_{dmax}$. In other words, the sample rate used during the first period and the second period ($f_s$) is $f_s \geq \max(2\alpha\tau_{0max}, 2f_{dmax})$. In some instances, the sample rate used during the first period and the second period ($f_s$) is greater than or equal to 0.1 GHz, 0.2 GHz, or 0.5 GHz and/or less than 1 GHz, 2 GHz, or 4 GHZ.

The above description of the LIDAR system operation assumes that a modulator is present on the utility waveguide 16; however, the modulator is optional. In these instances, the electronics can operate the light source 10(s) so as to increase the frequency of the outgoing LIDAR signal during the first period and during the second period the electronics can decrease the frequency of the outgoing LIDAR signal. Suitable methods for extracting the LIDAR data from the resulting composite signals are disclosed in U.S. Patent Application Ser. No. 62/671,913, filed on May 15, 218, entitled "Optical Sensor Chip," and incorporated herein in its entirety.

The electronics can operate the amplifiers 20. The amplifiers 20 can be amplitude amplifiers. Accordingly, the electronics can operate an amplifier so as to increase the power of the outgoing LIDAR signal and/or the incoming LIDAR signal. As a result, the amplifiers can increase the power of the LIDAR output signal(s) and/or the LIDAR input signal(s). When a LIDAR system includes multiple amplifiers on an amplifier chip, the electronics can operate the amplifiers independently. Alternately, the electronics can operate the amplifiers concurrently. As an example of concurrent operation of the amplifiers, the electronics operate amplifiers connected in series or in parallel.

The one or more amplifiers 20 can be integrated onto the platform of the LIDAR chip. For instance, the one or more amplifiers 20 can be integrated onto LIDAR chip constructed on a silicon-on-insulator wafer. An example of an amplifier construction that can be integrated onto a silicon-on-insulator wafer can be found in U.S. patent application Ser. No. 13/317,340, filed on Oct. 14, 2011, entitled Gain Medium Providing Laser and Amplifier Functionality to Optical Devices, and incorporated herein in its entirety.

In some instances, the one or more amplifiers 20 are included on a chip that is separate from the LIDAR chip and attached to the LIDAR chip. A suitable method for attaching a chip that includes one or more amplifiers to a LIDAR chip includes, but is not limited to, flip chip bonding.

Figure 11A:
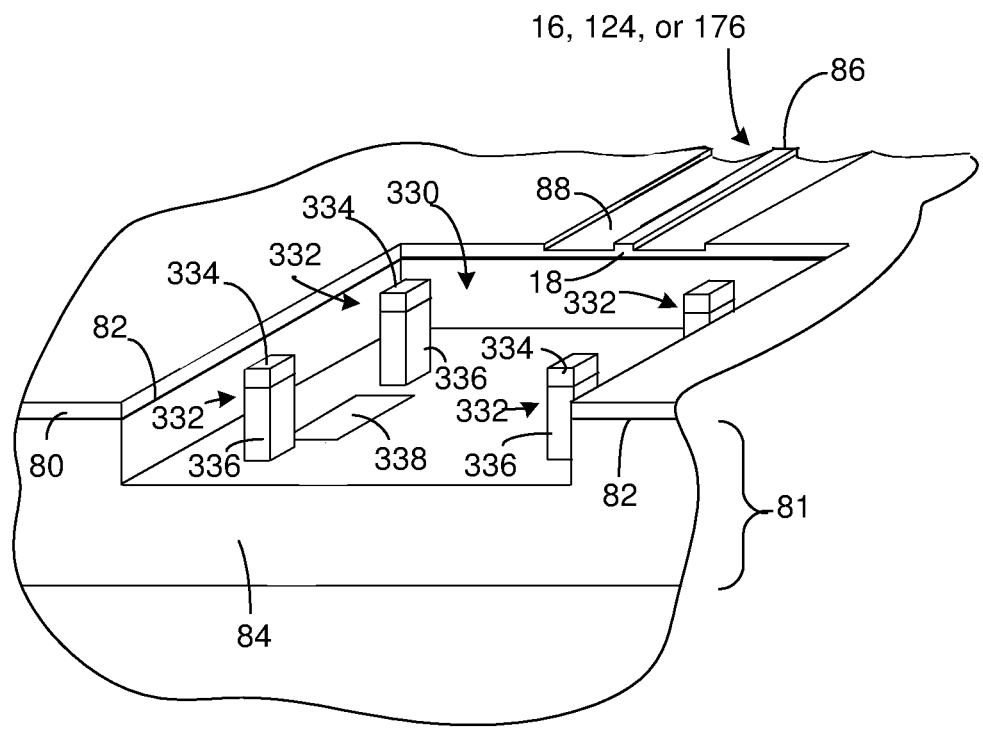
FIG. 11A is a perspective view of a portion of a LIDAR chip that includes an interface for optically coupling the LIDAR with an amplifier.

FIG. 11A is a perspective view of a portion of a LIDAR chip that includes an interface for optically coupling the LIDAR chip with an amplifier chip. The illustrated portion of the LIDAR chip includes a stop recess 330 sized to receive the auxiliary device. The stop recess 330 extends through the light-transmitting medium 80 and into the base 81. In the illustrated version, the stop recess 330 extends through the light-transmitting medium 80, the buried layer 82, and into the substrate 84.

The facet 18 of the utility waveguide 16 serves as a lateral side of the stop recess 30. Although not shown, the facet 31 of the utility waveguide 16 can include an anti-reflective coating. A suitable anti-reflective coating includes, but is not limited to, single-layer coatings such as silicon nitride or aluminum oxide, or multi-layer coatings, which may contain silicon nitride, aluminum oxide, and/or silica.

One or more stops 332 extend upward from a bottom of the stop recess 330. For instance, FIG. 11A illustrates four stops 332 extending upward from the bottom of the stop recess 330. The stops 332 include a cladding 334 positioned on a base portion 336. The substrate 84 can serve as the base portion 336 of the stops 332 and the stop 332 can exclude the buried layer 82. The portion of the substrate 84 included in the stops 332 can extend from the bottom of the stop recess 330 up to the level of the buried layer 82. For instance, the stops 332 can be formed by etching through the buried layer 82 and using the underlying substrate 84 as an etch-stop. As a result, the location of the top of the base portion 336 relative to the optical mode of a light signal in the utility waveguide 16 is well known because the buried layer 82 defines the bottom of the second waveguide and the top of the base portion 336 is located immediately below the buried layer 82. The cladding 334 can be formed on base portion 336 of the stops 332 so as to provide the stops 332 with a height that will provide the desired alignment between the utility waveguide 16 and an amplifier waveguide on an amplifier chip.

Attachment pads 338 are positioned on the bottom of the stop recess 330. The attachment pads 338 can be used to immobilize the amplifier chip relative to the LIDAR chip once the amplifier chip is positioned on the LIDAR chip. In some instances, the attachment pads 338 also provide electrical communication between the LIDAR chip and one or more amplifiers on an amplifier chip. Suitable attachment pads 338 include, but are not limited to, solder pads.

Figure 11B:
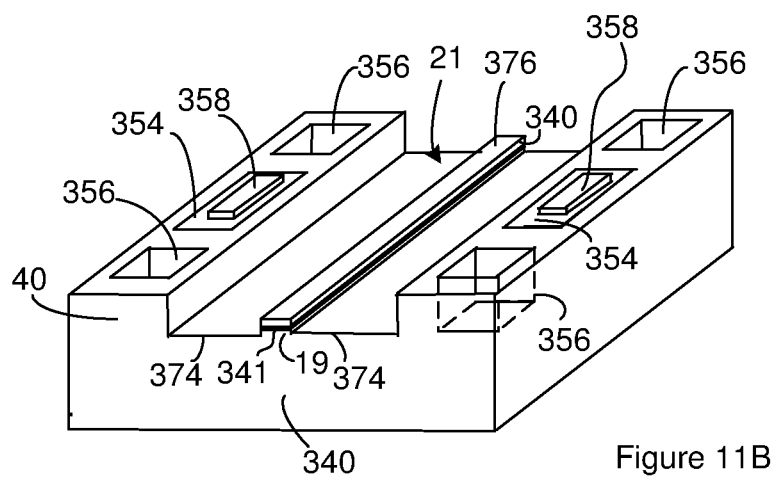
FIG. 11B is a perspective view of an amplifier chip suitable for use with the portion of the LIDAR chip shown in FIG. 11A.

FIG. 11B is a perspective view of one embodiment of an amplifier chip. The illustrated amplifier chip is within the class of devices known as planar optical devices. The amplifier chip includes an amplifier waveguide 21 defined in a gain medium 340. Suitable gain media include, but are not limited to, InP, InGaAsP, and GaAs.

Trenches 374 extending into the gain medium 340 define a ridge 376 in the gain medium 340. The ridge 376 defines the amplifier waveguide 21. In some instances, the gain medium 340 includes one or more layers 341 in the ridge and/or extending across the ridge 376. The one or more layers 341 can be positioned between different regions of the gain medium 340. The region of the gain medium 340 above the one or more layers 341 can be the same as or different from the region of the gain medium 340 below the one or more layers 341. The layers can be selected to constrain light signals guided through the amplifier waveguide 21 to a particular location relative to the ridge 376. Each of the layers 341 can have a different composition of a material that includes or consists of two or more components of selected from a group consisting of In, P, Ga, and As. In one example, the gain medium 340 is InP and the one or more layers 341 each includes Ga and As in different ratios.

The amplifier waveguide 21 provides an optical pathway between the first facet 19 and the second facet 22. Although not shown, the first facet 19 and/or the second facet 22 can optionally include an anti-reflective coating. A suitable anti-reflective coating includes, but is not limited to, single-layer coatings such as silicon nitride or aluminum oxide, or multi-layer coatings that may contain silicon nitride, aluminum oxide, and/or silica.

The amplifier chip includes one or more attachment pads 354 that can be employed to immobilize the amplifier chip relative to the LIDAR chip. Suitable attachment pads 354 include, but are not limited to, solder pads.

The amplifier chip also includes one or more alignment recesses 356. The dashed lines in FIG. 11B show the depth and shape of one of the alignment recesses 356.

Figure 11C:
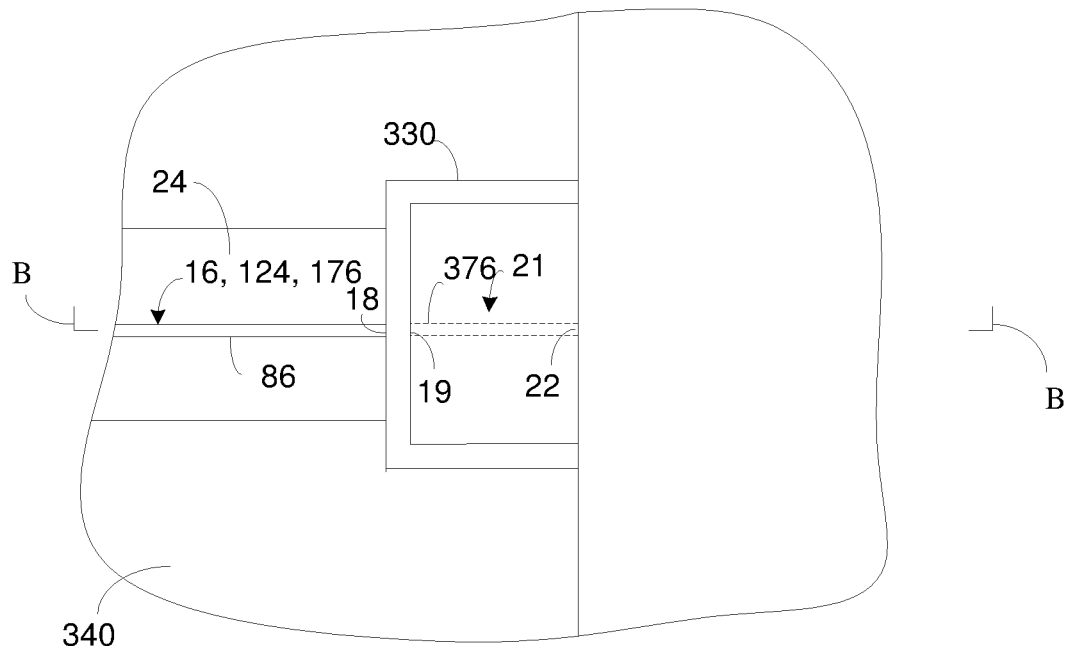
FIG. 11C and FIG. 11D illustrate system that includes the LIDAR chip of FIG. 11A interfaced with the amplifier of FIG. 11B.
Figure 11D:
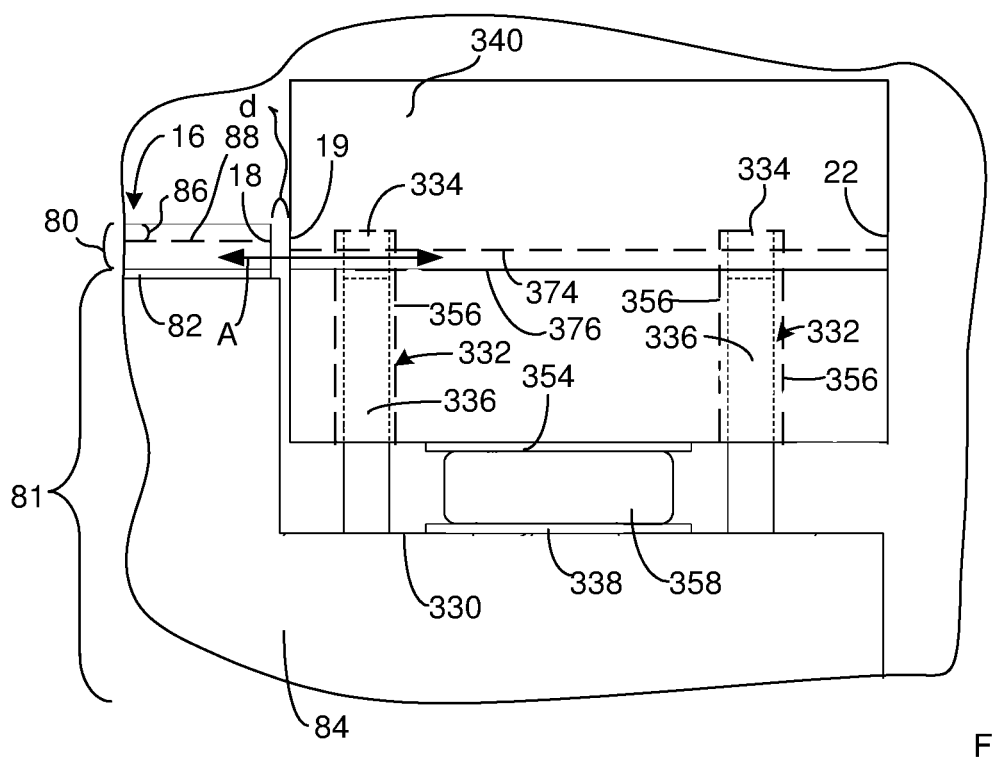

FIG. 11C and FIG. 11D illustrate a LIDAR system that includes the LIDAR chip of FIG. 11A interface with the amplifier chip of FIG. 11B. FIG. 11C is a topview of the LIDAR system. FIG. 11D is a sideview of a cross section of the system taken through the utility waveguide 16 on the LIDAR chip and the amplifier waveguide 21 on the amplifier chip. For instance, the cross section of FIG. 11D can be taken a long a line extending through the brackets labeled B in FIG. 11C. FIG. 11C and FIG. 11D each includes dashed lines that illustrate features that are located behind other features in the system. For instance, FIG. 11C includes dashed lines showing the ridge 376 of the amplifier waveguide 21 even though the ridge 376 is located under the gain medium 340. Additionally, FIG. 11D includes dashed lines that illustrate the locations of the portion of the stops 332 and alignment recesses 356 located behind the ridge 376 of the amplifier waveguide 21. FIG. 11D also includes dashed lines that illustrate the location where the ridge 86 of the utility waveguide 16 interfaces with the slab regions 88 that define the utility waveguide 16 also dashed lines that illustrate the location where the ridge 376 of the amplifier waveguide 21 interfaces with slab regions 374 of the amplifier chip.

The amplifier chip is positioned in the stop recess 330 on the LIDAR chip. The amplifier chip is positioned such that the ridge 376 of the amplifier waveguide 21 is located between the bottom of the amplifier chip and the base 21 of the LIDAR chip. Accordingly, the amplifier chip is inverted in the stop recess 330. Solder or other adhesive 358 contacts the attachment pads 338 on the bottom of the stop recess 330 and the attachment pads 354 on the amplifier chip. For instance, the solder or other adhesive 358 extends from an attachment pad 338 on the bottom of the stop recess 330 to an attachment pad 354 on the auxiliary device. Accordingly, the solder or other adhesive 358 immobilizes the auxiliary device relative to the LIDAR chip.

The facet 18 of the utility waveguide 16 is aligned with the first facet 19 of the amplifier waveguide 21 such that the utility waveguide 16 and the amplifier waveguide 21 can exchange light signals. As shown by the line labeled A, the system provides a horizontal transition path in that the direction that light signals travel between the LIDAR chip and the amplifier chip is parallel or is substantially parallel relative to an upper and/or lower surface of the base 21. A top of the first facet 19 of the amplifier waveguide 21 is at a level that is below the top of the facet 18 of the utility waveguide.

The one or more stops 332 on the LIDAR chip are each received within one of the alignment recesses 356 on the auxiliary device. The top of each stop 332 contacts the bottom of the alignment recess 356. As a result, the interaction between stops 332 and the bottom of the alignment recesses 356 prevent additional movement of the amplifier chip toward the LIDAR chip. In some instances, the auxiliary device rests on top of the stops 332.

As is evident from FIG. 11D, the first facet 19 of the amplifier waveguide 21 is vertically aligned with the facet 18 of the utility waveguide 16 on the LIDAR chip. As is evident from FIG. 11C, the first facet 19 of the amplifier waveguide 21 is horizontally aligned with the facet 18 of the utility waveguide 16 on the LIDAR chip. The horizontal alignment can be achieved by alignment of marks and/or features on the amplifier chip and the LIDAR chip.

The vertical alignment can be achieved by controlling the height of the stops 332 on the LIDAR chip. For instance, the cladding 334 on the base portion 336 of the stops 332 can be grown to the height that places the first facet 19 of the amplifier waveguide 21 at a particular height relative to the facet 18 of the utility waveguide 16 on the LIDAR chip. The desired cladding 334 thickness can be accurately achieved by using deposition techniques such as evaporation, plasma enhanced chemical vapor deposition (PECVD), and/or sputtering to deposit the one or more cladding layers. As a result, one or more cladding layers can be deposited on the base portion 336 of the stops 332 so as to form the stops 332 to a height that provides the desired vertical alignment. Suitable materials for layers of the cladding 334 include, but are not limited to, silica, silicon nitride, and polymers.

In FIG. 11D, the first facet 19 is spaced apart from the facet 18 by a distance labeled D. Since the amplifier waveguide is optically aligned with only one waveguide, the first facet 19 can be closer to the facet 18 than was possible with prior configurations. For instance, the distance between the first facet 19 and the facet 18 can be less than 5 µm, 3 µm, or 1 µm and/or greater than 0.0 µm. In FIG. 11D, the atmosphere in which the LIDAR chip is positioned is located in the gap between the first facet 19 and the facet 18; however, other gap materials can be positioned in the gap. For instance, a solid gap material can be positioned in the gap. Examples of suitable gap materials include, but are not limited to, epoxies and polymers.

Figure 12A:
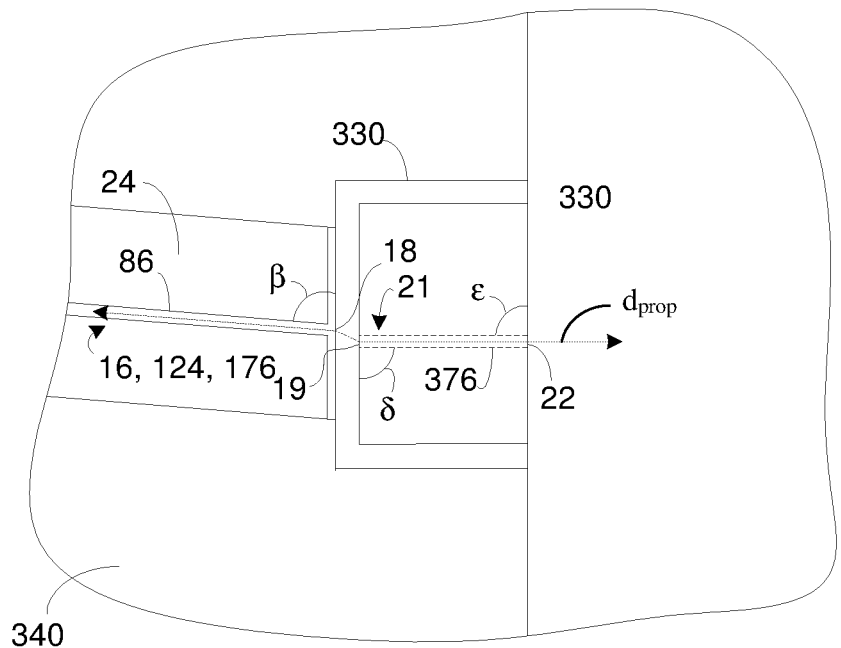
FIG. 12A is a topview of a LIDAR system that includes a utility waveguide with a facet at a non-perpendicular angle relative to a direction of propagation of a light signal in the utility waveguide.

One or more facets selected from the group consisting of the facet 18, the first facet 19, and the second facet 22 can have a non-perpendicular angle relative to the direction of propagation of the waveguide that terminates at the facet. For instance, FIG. 12A is a topview of the system of FIG. 11C modified such that the facet 18 is at an angle β relative to a direction of propagation of a light signal through the utility waveguide 16 at the facet 18. The direction of propagation of a light signal along an optical path through the utility waveguide 16 and the amplifier waveguide 21 is shown by the dashed line labeled $d_{prop}$. FIG. 12A also shows that the first facet 19 is at an angle δ relative to a direction of propagation of a light signal through the amplifier waveguide 21 at the first facet 19 and that the second facet 22 is at an angle ε relative to a direction of propagation of a light signal through the amplifier waveguide 21 at the second facet 22. As is evident in FIG. 11D, in some instances, one or more facets selected from the group consisting of the facet 18, the first facet 19, and the second facet 22 are perpendicular to a plane of the LIDAR chip such as the bottom of the LIDAR chip. For instance, one or more facets selected from the group consisting of the facet 18, the first facet 19, and the second facet 22 are perpendicular to a substrate such as a plane of the buried layer 82, the substrate 84, or of the amplifier 20.

Figure 12B:
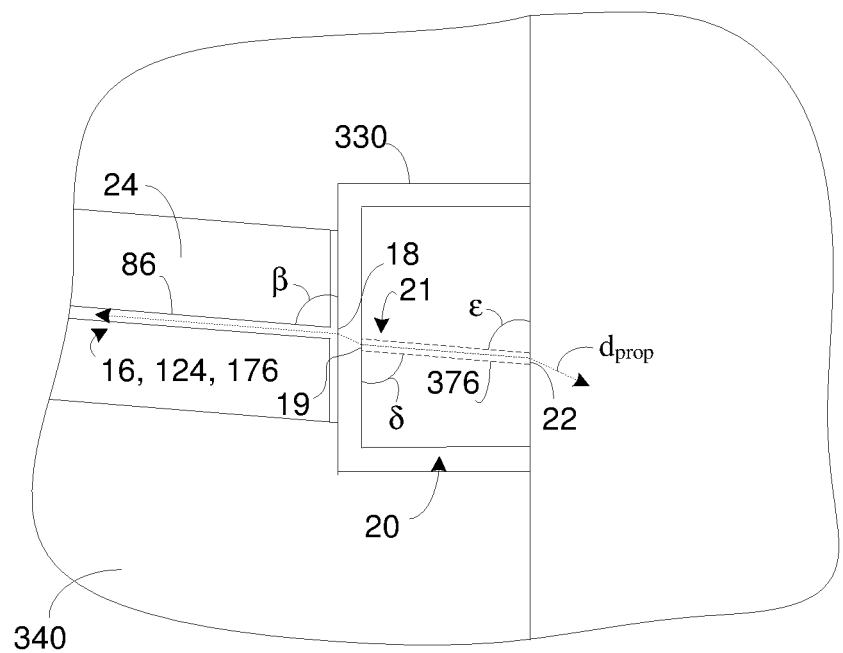
FIG. 12B is a topview of a LIDAR system that includes an amplifier waveguide with multiple facets at non-perpendicular angles relative to a direction of propagation of a light signal in the amplifier waveguide.

As shown in FIG. 12A, the value of the angle β can be less than 90°. Although the value of the angle δ and the angle ε are shown as 90° in FIG. 12A, the value of the angle δ, and/or the value of angle ε can be less than 90° as shown in FIG. 12B.

Figure 12C:
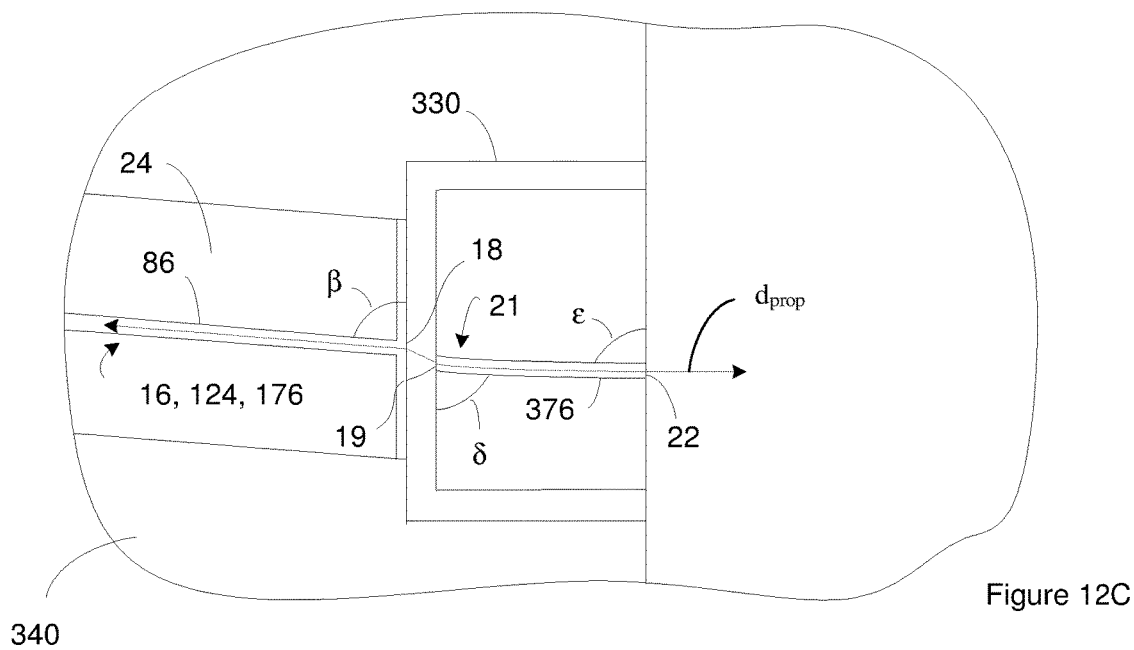
FIG. 12C is a topview of a LIDAR system that includes an amplifier waveguide with a facet at a non-perpendicular angle relative to a direction of propagation of a light signal in the amplifier waveguide and a second facet a perpendicular angle relative to the direction of propagation.

The value of all or a portion of the angles selected from the group consisting of angle β, angle δ, and angle ε can be the same or different. For instance, although FIG. 12A and FIG. 12B illustrate the value of the angle β as equal to the value of the angle δ, the value of the angle β can be different from the value of the angle δ. Although FIG. 12B illustrates the value of the angle δ as equal to the value of the angle ε, the value of the angle δ can be different from the value of the angle ε as shown in FIG. 12C. The difference in the value of the angle δ and the value of the angle ε can be achieved through the use of a curved amplifier waveguide 21 as shown in FIG. 12C. The curved waveguide allows the lateral sides of the amplifier 20 that contain the first facet 19 and the second facet 22 to be parallel while still having the angles that are desired for the first facet 19 and the second facet 22. Alternately, the difference in the value of the angle δ and the value of the angle ε can be achieved through the use of a straight amplifier waveguide 21 while the lateral sides of the of the amplifier 20 are not parallel.

A suitable value for the angle β, includes, but is not limited to, an angle greater than 70°, 75°, or 80° and/or less than 81°, 85°, or 90°. A suitable value for the angle δ, includes, but is not limited to, an angle greater than 70°, 75°, or 80° and/or less than 81°, 85°, or 90°. A suitable value for the angle ε, includes, but is not limited to, an angle greater than 70°, 80°, or 90°.

In some instances, the value of all or a portion of the angles selected from the group consisting of angle β, angle δ, and angle ε are selected to achieve one or more functions. For instance, the values of one, two, or three angles selected from the group consisting of angle β, angle δ, and angle ε can be selected to reduce the effect of back reflections in a waveguide. For instance, the values of the angle β can be selected to reduce back reflection in the utility waveguide 16, the values of the angle δ can be selected to reduce back reflection in the amplifier waveguide 21, and/or the values of the angle ε can be selected to reduce back reflection in the amplifier waveguide 21. A suitable value for an angle selected to reduce the effects of back reflection is an angle greater than 70°, 75°, or 80° and/or less than 81°, 85°, or 90°. In another example, the value of the angle ε is 90° in order to simplify packaging of the laser system. In another example, the angle ε is 90° while the value of angle β is less than 90° and the value of δ is less than 90°. In another example, the angle ε is 90° while the value of angle β is between 75° and 85° and the value of δ is between 75° and 85°.

Figure 13:
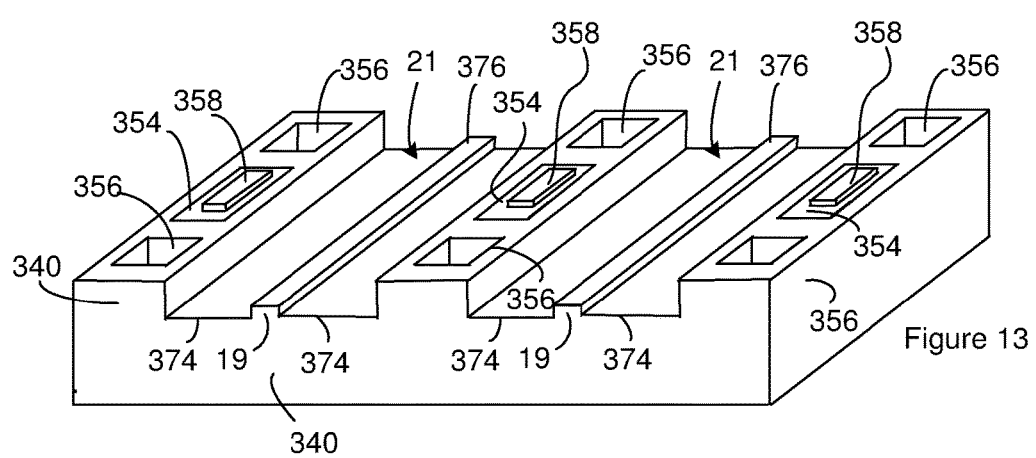
FIG. 13 is a perspective view of the amplifier chip of FIG. 11B through FIG. 11D modified to include two amplifiers.

The amplifier chip of FIG. 11B through FIG. 11D can be modified to include multiple amplifiers to provide an amplifier chip that is suitable for use in the LIDAR system of FIG. 5. For instance, FIG. 13 is a perspective view of the amplifier chip of FIG. 11B through FIG. 11D modified to include two amplifiers. The LIDAR chip can include electrical connectors such as metal traces, and/or solder bumps that provide electrical connections between the attachment pads 354 so as to connect the amplifiers in parallel or in series. Alternately, the amplifier chip can include an additional attachment pad (not shown) that allows the amplifiers to be operated independently.

Figure 14:
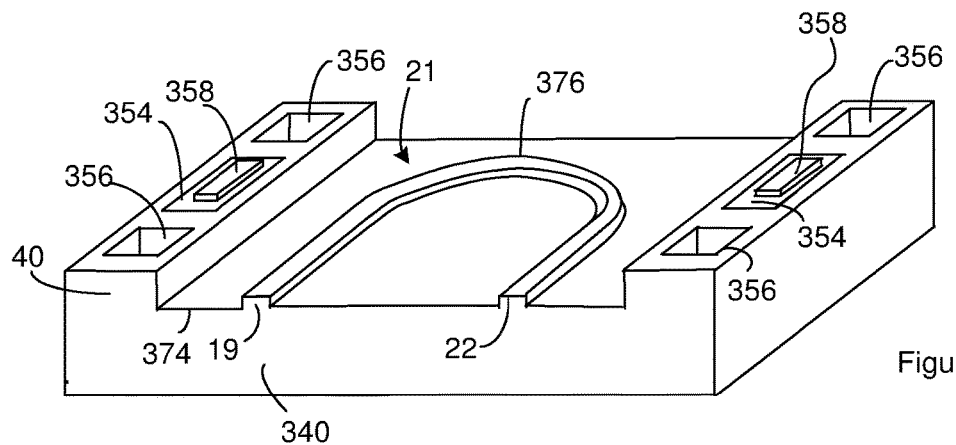
FIG. 14 is a perspective view of the amplifier chip of FIG. 11B through FIG. 11D modified such that an angle between the direction that the light signal travels when entering the amplifier waveguide and the direction that the light signal travels when exiting the amplifier waveguide is less than 180°.

The amplifier chip of FIG. 11B through FIG. 11D can be modified such that the angle between the direction that the light signal travels when entering the amplifier waveguide 21 and the direction that the light signal travels when exiting the amplifier waveguide 21 is less than 180° to provide an amplifier chip that is suitable for use in the LIDAR system of FIG. 6A. For instance, FIG. 14 is a perspective view of the amplifier chip of FIG. 11B through FIG. 11D modified such that the direction that the light signal travels when entering the amplifier waveguide 21 is parallel or essentially parallel to a direction that the light signal travels when exiting the amplifier waveguide 21. As a result, the angle between the direction that the outgoing LIDAR signal travels when entering the amplifier waveguide and the direction that the outgoing LIDAR signal travels when exiting the amplifier waveguide is 0°. The amplifier chip includes multiple lateral sides between a topside and a bottom side. A light signal enters the amplifier waveguide 21 through the same lateral side through which the light signal exits the amplifier waveguide 21.

Figure 15:
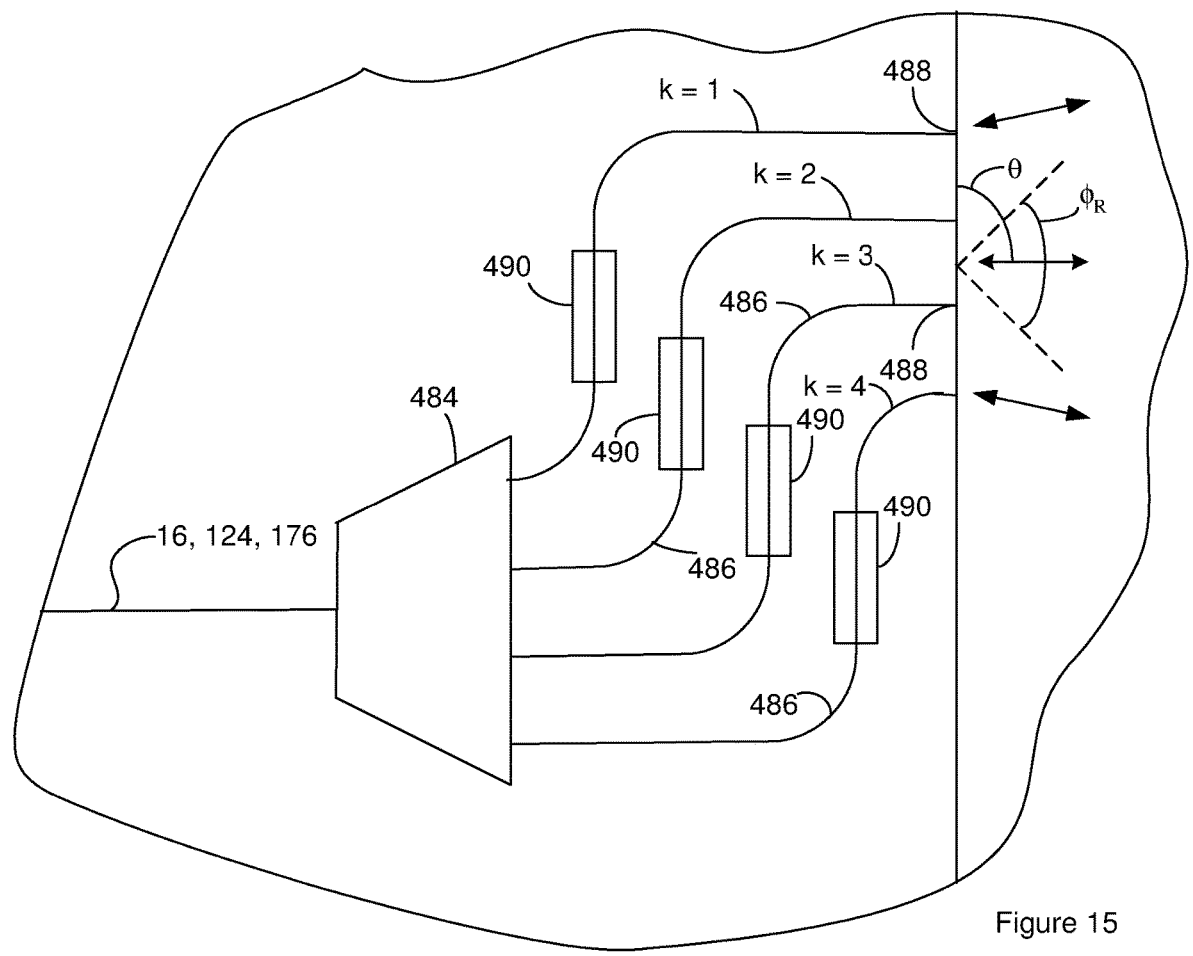
FIG. 15 is a schematic of an output component that includes beam steering capability and is suitable for use as an output component of a LIDAR chip constructed according to FIG. 6A.

FIG. 15 illustrates an example of an output component that includes beam steering capability and is suitable for use as the output component of FIG. 6A. The output component can be used in conjunction with a LIDAR chip constructed according to FIG. 1 through FIG. 2 and/or according to FIG. 3A through FIG. 5. For instance, the output component 178 includes a splitter 484 that can receive an outgoing light signal from the utility waveguide 16 of FIG. 1 or from one or more LIDAR signal waveguide 124 of FIG. 3A through FIG. 5 or from the second portion of the LIDAR signal waveguide 176 of FIG. 6A. The splitter 484 divides the outgoing light signal into multiple output signals that are each carried on a steering waveguide 486. Each of the steering waveguides ends at a facet 488. The facets are arranged such that the output signals exiting the chip through the facets combine to form the LIDAR output signal(s).

The splitter 484 and steering waveguides 486 can be constructed such that there is not a phase differential between output signals at the facet of adjacent steering waveguides. For instance, the splitter can be constructed such that each of the output signals is in-phase upon exiting from the splitter and the steering waveguides can each have the same length. Alternately, the splitter 484 and steering waveguides 486 can be constructed such that there is a linearly increasing phase differential between output signals at the facet of adjacent steering waveguides. For instance, the steering waveguides can be constructed such that the phase of steering waveguide number j is $f_o+(j-1)f$ where j is an integer from 1 to N and represents the number associated with a steering waveguide when the steering waveguides are sequentially numbered as shown in FIG. 8, f is the phase differential between neighboring steering waveguides when the phase tuners (discussed below) do not affect the phase differential, and $f_o$ is the phase of the output signal at the facet of steering waveguide k=1. Because the channels can have different wavelengths, the values of f and $f_o$ can each be associated with one of the channels. In some instances, this phase differential is achieved by constructing the steering waveguides such that the steering waveguides have a linearly increasing length differential. For instance, the length of steering waveguide j can be represented by $l_o+(k-1)\Delta l$ where k is an integer from 1 to K and represents the number associated with a steering waveguide when the steering waveguides are sequentially numbered as shown in FIG. 15, $\Delta l$ is the length differential between neighboring steering waveguide, and $L_o$ is the length of steering waveguide k=1. Because $\Delta l$ is a different percent of the wavelength of different channels included in the output signals, each of the different LIDAR output signals travels away from LIDAR chip in a different direction ($\theta$). When the steering waveguides are the same length, the value of $\Delta l$ is zero and the value of f is zero. Suitable $\Delta l$ include, but are not limited to, $\Delta l$ greater than 0, or 5 and/or less than 10, or 15 μm. Suitable f include, but are not limited to, f greater than $0\pi$, or $7\pi$ and/or less than $15\pi$, or $20\pi$. Suitable N include, but are not limited to, N greater than 10, or 500 and/or less than 1000, or 2000. The splitter 484 need not have demultiplexing functionality. Suitable splitters 484 include, but are not limited to, star couplers, cascaded Y-junctions and cascaded 1×2 MMI couplers.

A phase tuner 490 can optionally be positioned along at least a portion of the steering waveguides. Although a phase tuner is shown positioned along the first and last steering waveguide, these phase tuners are optional. For instance, the chip need not include a phase tuner on steering waveguide j=1.

The electronics can be configured to operate the phase tuners so as to create a phase differential between the output signals at the facet of adjacent steering waveguides. The electronics can operate the phase tuners such that the phase differential is constant in that it increases linearly across the steering waveguides. For instance, electronics can operate the phase tuners such that the tuner-induced phase of steering waveguide number k is $(k-1)\alpha$ where k is an integer from 1 to N and represents the number associated with a steering waveguide when the steering waveguides are sequentially numbered as shown in FIG. 15, $\alpha$ is the tuner-induced phase differential between neighboring steering waveguides. Accordingly, the phase of steering waveguide number k is $f_o+(k-1)f+(k-1)\alpha$. FIG. 15 illustrates the chip having only 4 steering waveguides in order to simplify the illustration, however, the chip can include more steering waveguides. For instance, the chip can include more than 4 steering waveguides, more than 100 steering waveguides, or more than 1000 steering waveguides and/or less than 10000 steering waveguides.

The electronics can be configured to operate the phase tuners so as to tune the value of the phase differential $\alpha$. Tuning the value of the phase differential $\alpha$ changes the direction that the LIDAR output signal travels away from the chip ($\theta$). Accordingly, the electronics can scan the LIDAR output signal by changing the phase differential $\alpha$. The range of angles over which the LIDAR output signal can be scanned is $\phi_R$ and, in some instances, extends from $\phi_v$ to $-\phi_v$ with $\phi=0°$ being measured in the direction of the LIDAR output signal when $\alpha=0$. When the value of $\Delta l$ is not zero, the length differential causes diffraction such that light of different wavelengths travels away from chip in different directions ($\theta$). Accordingly, there may be some spreading of the outgoing LIDAR signal as it travels away from the chip. Further, changing the level of diffraction changes the angle at which the outgoing LIDAR signal travels away from the chip when $\alpha=0°$. However, providing the steering waveguides with a length differential ($\Delta l \neq 0$) can simplify the layout of the steering waveguides on the chip.

Additional details about the construction and operation of an output component 178 constructed according to FIG. 15 can be found in U.S. Provisional Patent Application Ser. No. 62/680,787, filed on Jun. 5, 2018, and incorporated herein in its entirety.

Figure 16:
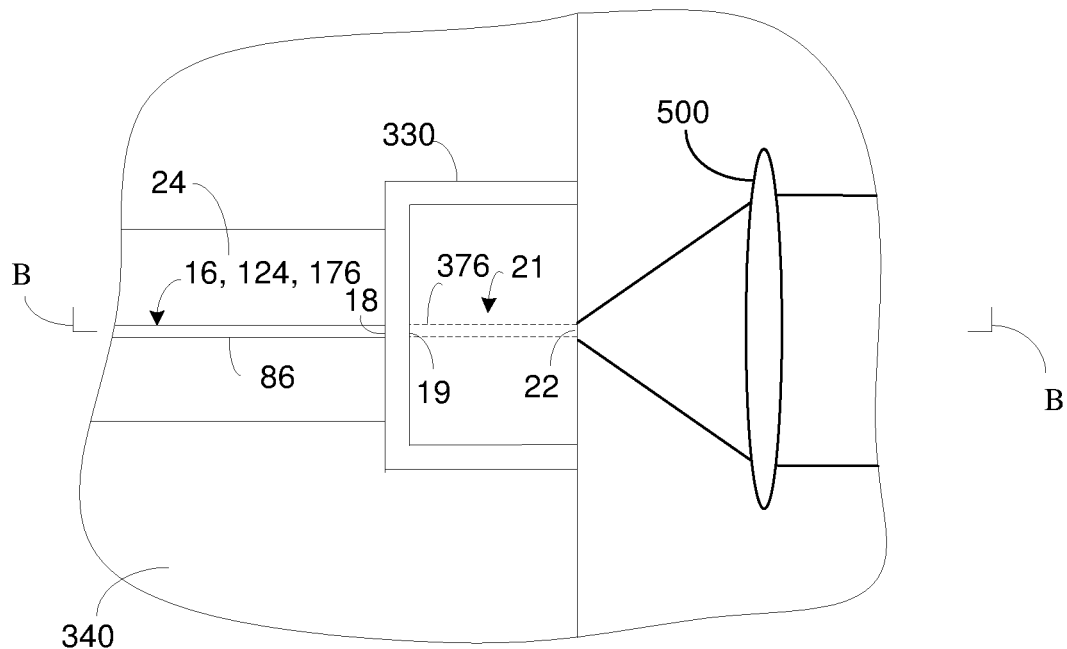
FIG. 16 illustrates a LIDAR system that includes a lens positioned to receive the LIDAR output signals from a LIDAR chip.

The LIDAR system can include optical components in addition to the LIDAR chip. For instance, the LIDAR system can include one or more lenses that receive the one or more LIDAR output signals transmitted from the LIDAR chip. In some instance, the lenses are positioned so as to focus the one or more LIDAR output signals or collimate the one or more LIDAR output signals. FIG. 16 illustrates a LIDAR system that includes a lens 500 positioned to receive the one or more LIDAR output signals transmitted from the LIDAR chip and to collimate the one or more LIDAR output signals. In the embodiments illustrated above, the LIDAR output signals can travel away from the LIDAR system and serve as the system output signals. In the LIDAR system of FIG. 16, the light output from the lens can serve as the system output signal.

Although the facets in FIG. 13 through FIG. 16 are illustrated as being perpendicular to the direction of propagation of a light signal in an amplifier waveguide 21, the amplifiers in FIG. 13 through FIG. 16 can be constructed such that all or a portion of the facets are non-perpendicular to the direction of propagation of a light signal in the amplifier waveguide 21 as disclosed in the context of FIG. 12A through FIG. 12C. Similarly, the waveguides on the LIDAR chip that are interfaced with the amplifier waveguide 21 can be constructed such that all or a portion of the facets are non-perpendicular to the direction of propagation of a light signal in the waveguide as disclosed in the context of FIG. 12A through FIG. 12C.

Figure 17:
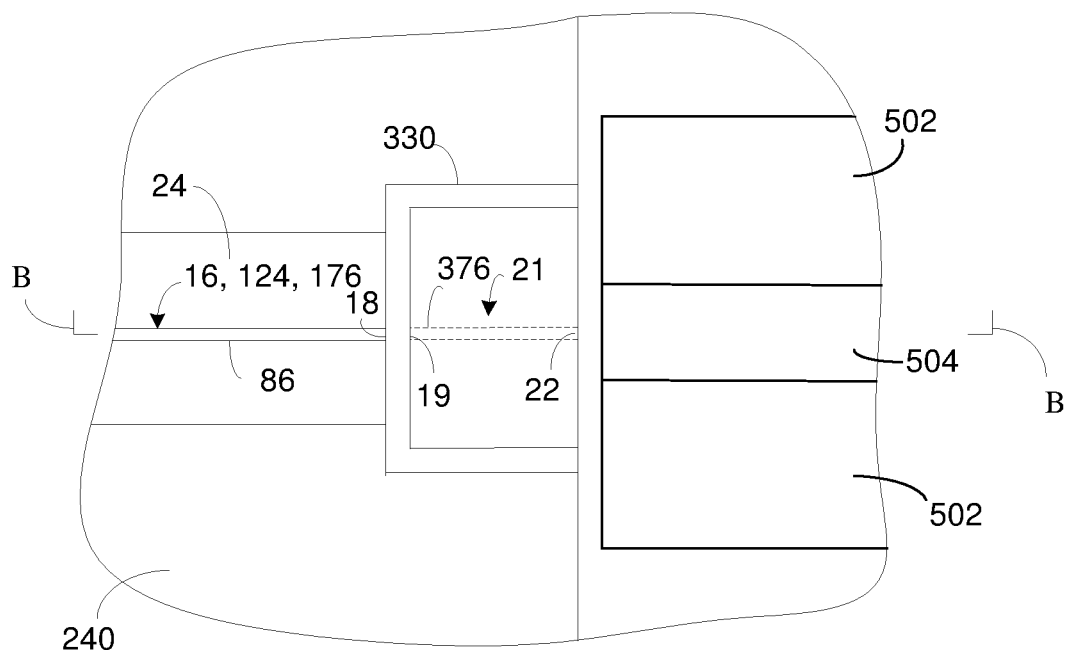
FIG. 17 illustrates a LIDAR system that includes an optical fiber positioned to receive the LIDAR output signals from a LIDAR chip.

The LIDAR system can include an optical fiber that receive the one or more LIDAR output signals transmitted from the LIDAR chip. FIG. 17 illustrates an optical fiber that receives the one or more LIDAR output signals transmitted from the LIDAR chip. The optical fiber includes a cladding 502 on a core 504. The core 504 is aligned with the second facet 22 so the core 504 and the amplifier waveguide can exchange light signals. Suitable mechanisms for immobilizing the terminal end of the optical fiber relative to the LIDAR chip include, but are not limited to, fiber blocks, V-grooves, and ferrules. The LIDAR system can output a system output signal that travels away from the LIDAR system and includes or consists of the portion of the LIDAR output signal that was received by the optical fiber. After reflection by an object located outside of the LIDAR system, all or a portion of the reflected light can return to the optical fiber and amplifier waveguide.

A variety of platforms can be employed for the LIDAR chip. A suitable platform includes, but is not limited to, a silicon-on-insulator wafer. One or more of the above components and/or portions of the above components can be integral with the chip or can be placed on the chip with technologies such as flip-chip bonding technologies. For instance, a light source 110 and/or a light sub-source 111 can include a gain element and one or more other components such as waveguides. The waveguide can be integral with the chip and the gain element can be a component that is separate from the chip but attached to the chip with a flip-chip bonding. Alternately, the above LIDAR system can be constructed with discrete components. For instance, all or a portion of the waveguides can be optical fibers connecting discrete components. Alternately, one or more portions of the LIDAR system can be integrated on a chip while other portions are discrete components. For instance, the utility waveguide 16 can be or include an optical fiber that provides optical communication between a light source 110 and an optical chip that includes the remainder of the LIDAR system.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A LIDAR system, comprising:
a LIDAR chip that generates a LIDAR output signal, the LIDAR chip including multiple LIDAR chip waveguides on a base, the LIDAR chip waveguides including a utility waveguide configured to carry one or more light signals selected from an outgoing LIDAR signal and an incoming LIDAR signal; and
the LIDAR chip including an amplifier on the base, the amplifier having an amplifier waveguide defined in a gain medium that terminates at a first facet and a second facet, the amplifier being positioned such that the first facet is optically aligned with a facet of the utility waveguide but the second facet is not optically aligned with any of the LIDAR chip waveguides,
the amplifier being included on an amplifier chip that is flip-chip bonded to the LIDAR chip.

2. The system of claim 1, wherein the LIDAR chip waveguides are integrated on the LIDAR chip.

3. The LIDAR system of claim 1, wherein the amplifier waveguide receives the outgoing LIDAR signal from the utility waveguide and the amplifier waveguide guides the received outgoing LIDAR signal through the second facet, the amplifier positioned such that the outgoing LIDAR signal exits from the LIDAR chip as a result of passing through the second facet.

4. The LIDAR system of claim 3, wherein the outgoing LIDAR signal includes multiple wavelength channels.

5. The LIDAR system of claim 1, wherein the amplifier waveguide receives the incoming LIDAR signal from off the LIDAR chip when the utility waveguide carries the incoming LIDAR signal, the amplifier waveguide guiding the incoming LIDAR signal from the second facet through the first facet, and the utility waveguide receives the incoming LIDAR signal from the amplifier waveguide.

6. The LIDAR system of claim 1, wherein the amplifier chip is positioned at an edge of the LIDAR chip such that a line can be drawn starting at the second facet and extending away from the amplifier chip in a direction of propagation of the outgoing LIDAR signal at the second facet and without the line passing through any portion of the LIDAR chip.

7. The LIDAR system of claim 1, wherein the LIDAR chip has the utility waveguide positioned on a base and a level of a top of the amplifier waveguide is between a level of a top of the utility waveguide and a level of the base.

8. The LIDAR system of claim 1, wherein the facet of the utility waveguide is spaced apart from the first facet.

9. The LIDAR system of claim 1, wherein the utility waveguide carries both the incoming LIDAR signal and the outgoing LIDAR signal.

10. The LIDAR system of claim 1, wherein the LIDAR chip is constructed on a silicon-on-insulator platform.

11. The LIDAR system of claim 1, wherein the second facet is optically aligned with a facet of an optical fiber.

12. The LIDAR system of claim 1, wherein the facet of the utility waveguide is at an angle between 75° and 85° relative to a direction of propagation of the utility waveguide at the facet of the utility waveguide, and
the amplifier waveguide is curved such that the first facet is at an angle between 75° and 85° relative to a direction of propagation of the amplifier waveguide at the first facet and the second facet is at an angle of 90° relative to a direction of propagation of the amplifier waveguide at the second facet.

13. The LIDAR system of claim 1, wherein the first facet and the second facet are configured such that the one or more light signals are transmitted through the first facet and the second facet during operation of the LIDAR system.

14. The LIDAR system of claim 1, wherein the base includes a silicon substrate and the LIDAR chip waveguides and the amplifier waveguide is positioned on the silicon substrate.

15. The LIDAR system of claim 1, wherein the LIDAR chip includes a signal combining component configured to combine a reference signal with a comparative signal so as to form a composite signal beating at a beat frequency, the comparative signal includes light that has been reflected by an object located outside of the LIDAR system, the reference signal includes light that has not been reflected by any object located outside of the LIDAR system.

16. The LIDAR system of claim 15, further comprising electronics that calculate LIDAR data from the beat frequency, the LIDAR data indicating a distance and/or radial velocity between the LIDAR system and the object located outside of the LIDAR system.

17. The LIDAR system of claim 15, wherein the reference signal includes light from the outgoing LIDAR signal and the comparative signal includes light from the outgoing LIDAR signal.

18. A LIDAR system, comprising:
a LIDAR chip that generates a LIDAR output signal, the LIDAR chip including multiple LIDAR chip waveguides on a base, the LIDAR chip waveguides including a utility waveguide configured to carry one or more light signals selected from an outgoing LIDAR signal and an incoming LIDAR signal; and
the LIDAR chip including an amplifier on the base, the amplifier having an amplifier waveguide defined in a gain medium that terminates at a first facet and a second facet, the amplifier being positioned such that the first facet is optically aligned with a facet of the utility waveguide but the second facet is not optically aligned with any of the LIDAR chip waveguides,
the facet of the utility waveguide being at an angle between 75° and 85° relative to a direction of propagation of the utility waveguide at the facet of the utility waveguide, and
the amplifier waveguide being curved such that the first facet is at an angle between 75° and 85° relative to a direction of propagation of the amplifier waveguide at the first facet and the second facet is at an angle of 90° relative to a direction of propagation of the amplifier waveguide at the second facet.

19. The system of claim 18, wherein the LIDAR chip waveguides are integrated on the LIDAR chip.

20. The LIDAR system of claim 18, wherein the amplifier waveguide receives the outgoing LIDAR signal from the utility waveguide and the amplifier waveguide guides the received outgoing LIDAR signal through the second facet, the amplifier positioned such that the outgoing LIDAR signal exits from the LIDAR chip as a result of passing through the second facet.

21. The LIDAR system of claim 18, wherein the amplifier waveguide receives the incoming LIDAR signal from off the LIDAR chip when the utility waveguide carries the incoming LIDAR signal, the amplifier waveguide guiding the incoming LIDAR signal from the second facet through the first facet, and the utility waveguide receives the incoming LIDAR signal from the amplifier waveguide.

22. The LIDAR system of claim 18, wherein the LIDAR chip has the utility waveguide positioned on a base and a level of a top of the amplifier waveguide is between a level of a top of the utility waveguide and a level of the base.

23. The LIDAR system of claim 18, wherein the facet of the utility waveguide is spaced apart from the first facet.

24. The LIDAR system of claim 18, wherein the LIDAR chip is constructed on a silicon-on-insulator platform.

25. The LIDAR system of claim 18, wherein the second facet is optically aligned with a facet of an optical fiber.

26. The LIDAR system of claim 18, wherein the LIDAR chip includes a signal combining component configured to combine a reference signal with a comparative signal so as to form a composite signal beating at a beat frequency, the comparative signal includes light that has been reflected by an object located outside of the LIDAR system, the reference signal includes light that has not been reflected by any object located outside of the LIDAR system.

27. The LIDAR system of claim 26, further comprising electronics that calculate LIDAR data from the beat frequency, the LIDAR data indicating a distance and/or radial velocity between the LIDAR system and the object located outside of the LIDAR system.

28. The LIDAR system of claim 26, wherein the reference signal includes light from the outgoing LIDAR signal and the comparative signal includes light from the outgoing LIDAR signal.

29. A LIDAR system, comprising:
a LIDAR chip that generates a LIDAR output signal, the LIDAR chip including multiple LIDAR chip waveguides on a base, the LIDAR chip waveguides including a utility waveguide configured to carry one or more light signals selected from an outgoing LIDAR signal and an incoming LIDAR signal; and
the LIDAR chip including an amplifier on the base, the amplifier having an amplifier waveguide defined in a gain medium that terminates at a first facet and a second facet, the amplifier being positioned such that the first facet is optically aligned with a facet of the utility waveguide but the second facet is not optically aligned with any of the LIDAR chip waveguides;
the LIDAR chip including a signal combining component configured to combine a reference signal with a comparative signal so as to form a composite signal beating at a beat frequency,
the comparative signal including light that has been reflected by an object located outside of the LIDAR system,
the reference signal including light that has not been reflected by any object located outside of the LIDAR system,
the reference signal including light from the outgoing LIDAR signal and the comparative signal including light from the outgoing LIDAR signal.

30. The system of claim 29, wherein the LIDAR chip waveguides are integrated on the LIDAR chip.

31. The LIDAR system of claim 29, wherein the amplifier waveguide receives the outgoing LIDAR signal from the utility waveguide and the amplifier waveguide guides the received outgoing LIDAR signal through the second facet, the amplifier positioned such that the outgoing LIDAR signal exits from the LIDAR chip as a result of passing through the second facet.

32. The LIDAR system of claim 29, wherein the amplifier waveguide receives the incoming LIDAR signal from off the LIDAR chip when the utility waveguide carries the incoming LIDAR signal, the amplifier waveguide guiding the incoming LIDAR signal from the second facet through the first facet, and the utility waveguide receives the incoming LIDAR signal from the amplifier waveguide.

33. The LIDAR system of claim 29, wherein the LIDAR chip has the utility waveguide positioned on a base and a level of a top of the amplifier waveguide is between a level of a top of the utility waveguide and a level of the base.

34. The LIDAR system of claim 29, wherein the facet of the utility waveguide is spaced apart from the first facet.

35. The LIDAR system of claim 29, wherein the LIDAR chip is constructed on a silicon-on-insulator platform.

36. The LIDAR system of claim 29, wherein the second facet is optically aligned with a facet of an optical fiber.

37. The LIDAR system of claim 29, further comprising electronics that calculate LIDAR data from the beat frequency, the LIDAR data indicating a distance and/or radial velocity between the LIDAR system and the object located outside of the LIDAR system.

\* \* \* \* \*